(12) United States Patent
Kang

(10) Patent No.: US 7,668,008 B2
(45) Date of Patent: Feb. 23, 2010

(54) 1-TRANSISTOR TYPE DRAM CELL, A DRAM DEVICE AND MANUFACTURING METHOD THEREFORE, DRIVING CIRCUIT FOR DRAM, AND DRIVING METHOD THEREFOR

(75) Inventor: Hee Bok Kang, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 199 days.

(21) Appl. No.: 11/781,421

(22) Filed: Jul. 23, 2007

(65) Prior Publication Data

US 2008/0049537 A1    Feb. 28, 2008

(30) Foreign Application Priority Data

| Jul. 21, 2006 | (KR) | ...................... 10-2006-0068749 |
| Aug. 9, 2006 | (KR) | ...................... 10-2006-0075404 |
| Aug. 9, 2006 | (KR) | ...................... 10-2006-0075411 |
| Aug. 9, 2006 | (KR) | ...................... 10-2006-0075412 |

(51) Int. Cl.
*G11C 11/34*    (2006.01)
(52) U.S. Cl. .................. 365/184; 365/182; 365/176
(58) Field of Classification Search ................ 365/184, 365/182, 176
See application file for complete search history.

(56) References Cited

U.S. PATENT DOCUMENTS

| 5,448,513 | A * | 9/1995 | Hu et al. ...................... 365/150 |
| 6,548,848 | B2 * | 4/2003 | Horiguchi et al. ........... 257/296 |
| 6,778,424 | B2 * | 8/2004 | Iwata et al. .................. 365/149 |
| 6,937,516 | B2 | 8/2005 | Fazan et al. |
| 7,057,926 | B2 * | 6/2006 | Ohsawa ....................... 365/177 |
| 7,271,433 | B1 * | 9/2007 | Forbes ......................... 257/302 |
| 2002/0110018 | A1 * | 8/2002 | Ohsawa ....................... 365/149 |

FOREIGN PATENT DOCUMENTS

| KR | 100177783 | 11/1998 |
| KR | 1020000003617 | 1/2000 |

(Continued)

OTHER PUBLICATIONS

Kuo et al., IEEE Electron Device Letters, vol. 23, No. 6, Jun. 2002, pp. 345-347.*

(Continued)

*Primary Examiner*—J. H. Hur
(74) *Attorney, Agent, or Firm*—Ladas & Parry LLP

(57) ABSTRACT

The present invention relates to an 1-transistor DRAM cell, a DRAM device and a manufacturing method therefor, a driving circuit for a DRAM, a driving method therefore, and a driving method for an 1-transistor DRAM, and a double-gate type 1-transistor DRAM. The present invention comprises a data hold process biasing a word line at a negative voltage level and biasing a sensing line and a bit line at a first constant voltage level; a data purging process resetting data by biasing the word line and the bottom word line at a second constant voltage level and biasing the sensing line and the bit line at the first constant voltage level; and a data write process biasing the word line and the bottom word line at the second constant voltage level and supplying a write data to the bit line.

3 Claims, 27 Drawing Sheets

FOREIGN PATENT DOCUMENTS

| | | |
|---|---|---|
| KR | 1020000033906 | 6/2000 |
| KR | 1020010048993 | 6/2001 |
| KR | 2002-0002518 A | 1/2002 |
| KR | 1020020002518 | 1/2002 |
| KR | 100349371 | 8/2002 |
| KR | 2002-0082545 A | 10/2002 |
| KR | 2003-0021375 A | 3/2003 |
| KR | 2003-0058640 A | 7/2003 |
| KR | 1020030057173 | 7/2003 |
| KR | 2004-0053447 A | 6/2004 |
| KR | 1020050025822 | 3/2005 |
| KR | 1020060027484 | 3/2006 |
| KR | 1020060076162 | 7/2006 |
| KR | 100669558 | 1/2007 |

OTHER PUBLICATIONS

Kuo et al., IEEE Transactions on Electron Devices, vol. 50, No. 12, Dec. 2003, pp. 2408-2416.*

Notice of Patent Grant mailed Jan. 14, 2008 corresponding to KR 10-2006-0075411.

Notice of Patent Grant mailed Jan. 11, 2008 corresponding to KR 10-2006-0075404.

Notice of Patent Grant mailed Jan. 16, 2008 corresponding to KR 10-2006-0075412.

Notice of Preliminary Rejection-Korean Intellectual Property Office Sep. 18, 2007.

* cited by examiner

P-type Substrate

1-TRANSISTOR TYPE DRAM CELL, A DRAM DEVICE AND MANUFACTURING METHOD THEREFORE, DRIVING CIRCUIT FOR DRAM, AND DRIVING METHOD THEREFOR

CROSS-REFERENCE TO RELATED APPLICATIONS

The present application claims priority to Korean patent application numbers 10-2006-0068749 filed on Jul. 21, 2006, 10-2006-0075404 filed on Aug. 9, 2006, 10-2006-0075411 filed on Aug. 9, 2006 and 10-2006-0075412 filed on Aug. 9, 2006 which are incorporated herein by reference in their entirety.

BACKGROUND OF THE INVENTION

The present invention relates to a DRAM, and more particularly to an 1-transistor type DRAM cell, a DRAM device and a manufacturing method therefore, a driving circuit for a DRAM, and a driving method therefor.

A representative device of a semiconductor memory device is a DRAM. The DRAM generally has a constitution configured of one transistor and one storage capacitor, wherein the constitution forms one unit cell. A digital data 1 (high) or 0 (low) is stored in the storage capacitor. In order to normally maintain a data level stored in the storage capacitor, the DRAM performs a refresh operation which is a recharge operation, while having a constant time interval. The DRAM having such a unit cell has been developed up to a synchronous semiconductor memory device referred to as a double data rate (DDR) SDRAM series (currently, developed up to a DDR3).

However, as the density of the DRAM progresses to giga-grade, the area of the chip should be larger. This will be acted as a burden in view of a system that as the chip size becomes smaller, it has an advantage.

In order to this burden, one of the proposed methods is the 1-transistor type DRAM allowing the unit cell to be configured of only one transistor by removing the storage capacitor. The 1-transistor type DRAM is also referred to as a capacitor-less type DRAM.

FIG. 1 is a cross-sectional view showing a cross section constitution of a unit cell structure of an 1-transistor type DRAM according to the prior art. The constitution of FIG. 1 indicates a floating body cell or floating channel cell with a silicon on insulator (SOI) structure. As shown in FIG. 1, data are stored by storing holes and electrons on the floating body.

FIG. 2 is a view showing a flow process of a read current and a cell data storing state of the 1-transistor DRAM according to the prior art. In FIG. 2, 2A is a Store "1" which is a state storing a data 1, wherein the Store "1" state is a state where there are many holes in the floating body. In FIG. 2, 2B is a Store "0" which is a state storing a data 0, wherein the Store "0" state is a state where there are a few holes in the floating body or there are many electrons therein. In FIG. 2, 2C indicates a flow of a read current, wherein in a read mode, more sensing current in a cell current flows in the store "1" than in the store "0". In FIG. 2, a line connected to the gate of the transistor is a word line and each of lines connected to both channels of the transistor indicates a sensing line and a bit line.

FIG. 3 is a waveform view showing waveform characteristics of a cell read current of the 1-transistor type DRAM according to the prior art. In FIG. 3, when a cell drain voltage Vd is 0.2V and a cell source voltage is a ground GND, there is shown a cell read current at the time of sweeping a cell gate voltage. As shown, the read current is largest in the Store "1" and smallest in the Store "0", and a reference (REF) current is located in the middle thereof.

As such, the floating body DRAM cell with the 1-transistor structure of the prior art does not destroy the cell data by means of a non destructive read out (NDRD) manner when performing a read operation, making it possible to improve the reliability of the cell and the read speed. Also, since the cell is configured of only the 1-transistor, the cell size can remarkably be reduced.

However, the following problem occurs when reading information on the cell and writing information in the cell. In other words, when writing the information, as a write voltage is applied to the selected cells as well as the non-selected cells, the problem that the data of the non-selected cells are destroyed occurs. The reliability of the semiconductor memory device cannot be assured due to this problem.

Meanwhile, when implementing a semiconductor device by applying the SOI wafer, it is advantageous in view of the device characteristics; however, it is not preferable in view of productivity since the SOI wafer is more expensive than a general silicon wafer.

In particular, when manufacturing a semiconductor device by applying the SOI wafer, the existing equipments and processes are designed to be suitable for the case applying the silicon wafer. Therefore, when manufacturing the semiconductor device by applying the SOI wafer, there are the problems that the modification and development of the manufacturing equipments and processes are also required.

SUMMARY OF THE INVENTION

The present invention proposes to solve the problems as described above. The present invention provides an 1-transistor type DRAM driving circuit and a driving method therefor.

The present invention provides an 1-transistor type DRAM driving circuit and a driving method therefore capable of preventing the data of non-selected cells other than selected cells from being destroyed.

The prevention invention provides an 1-transistor type DRAM driving circuit and a driving method therefore having a double data structure assuring a reliable write operation.

The present invention provides an 1-transistor type DRAM driving circuit and a driving method therefore with a double gate structure capable of driving a multi level.

The present invention provides a DRAM cell, a DRAM device comprising thereof, and a manufacturing method therefor, capable of preventing the reduction of productivity using a silicon substrate formed of a bulk silicon.

The present invention provides a DRAM cell, a DRAM comprising thereof, and a manufacturing method thereof, capable of obtaining easiness and reliability of a manufacturing process since equipments and processes designed to be suitable for the case where the existing silicon substrate is applied can be applied as it is.

According to the present invention, there is provided an 1-transistor type DRAM driving circuit having a double gate structure comprising: a transistor storing data on a floating body; a word line formed on the upper side of the transistor and controlling the transistor; a bottom word line formed on the lower side of the transistor and controlling the transistor; a sensing line connected to the memory cell; a bit line connected to the memory cell; a sense amp sensing data on the bit line; and a register connected to a bit line.

According to the present invention, there is provided a driving method for an 1-transistor type DRAM having a double gate structure comprising: a data hold process biasing a word line and a bottom word line at a negative voltage level and biasing a sensing line and a bit line at a first constant voltage level; a data purging process resetting data by biasing the word line and the bottom word line at a second constant voltage level and biasing the sensing line and the bit line at the first constant voltage level; and a data write process biasing the word line and the bottom word line at the second constant voltage level and supplying a write data to the bit line.

Herein, the method can further comprise, after the data write process, a second data hold process holding the write data by biasing the word line and the bottom word line at the negative voltage level. And, the write data may be digital logic 0 or 1.

According to the present invention, there is provided a driving method for an 1-transistor type DRAM having a double gate structure comprising: a first data hold process biasing a word line at a negative voltage level and biasing a bottom word line, a sensing line, and a bit line at a first constant voltage level; a second data hold process biasing a read voltage to the bit line during the first data hold processes; a sensing process supplying voltage to the word line and allowing a read current to be flowed from the bit line to the sensing line after the second data hold process; and after the sensing process, a third data hold process biasing the word line at the negative voltage level and stopping the flow of the read current.

Herein, the method can further comprises, after the third data hold process, a fourth data hold process biasing the bit line at the first constant voltage level.

According to the present invention, there is provided a driving method of an 1-transistor type DRAM having a double data structure comprising: a first process sensing and amplifying cell data for all cells in a row selected from a read cycle through a sense amp; a second process storing the sensing data in a register after the first process; a third process transmitting data stored in the register to a write driver in a write cycle after the read cycle; and a fourth process restoring data by performing a write on the cells through the write driver.

According to the present invention, there is provided a driving method of an 1-transistor type DRAM having a double data structure comprising: a first process sensing and amplifying cell data for all cells in a selected row through a sense amp; a second process storing the sensing data in a register after the first process; a third process transmitting data stored in the register to a write driver; and a fourth process refreshing the cell data by performing a write on the cells through the write driver.

According to the present invention, there is provided a driving method of an 1-transistor type DRAM having a double data structure comprising: a data hold process biasing a word line and a bottom line at a negative voltage level and biasing a sensing line and a bit line at a first constant voltage level; a data purging process resetting data by biasing the word line and the bottom line at a second constant voltage level and biasing the sensing line and the bit line at the first constant voltage level; and a data write process allowing a write current to be flowed from a floating body to the bit line by raising the bit line at the second constant voltage level and raising the sensing line to a half of second constant voltage level, while maintaining the bias of the word line and the bottom line at the second constant voltage level.

Herein, the method can further comprise, after the data write process, a second data hold process holding the write data by biasing the word line and the bottom word line at the negative voltage level. And, the write data may be digital logic 0 or 1.

According to the present invention, there is provided a driving method of an 1-transistor type DRAM having a double data structure comprising: a data hold process biasing a word line and a bottom line at a negative voltage level and biasing a sensing line and a bit line at a first constant voltage level; a data purging process resetting data by biasing the word line and the bottom line at a second constant voltage level and biasing the sensing line and the bit line at the first constant voltage level; and a data write process allowing a write current to be flowed from a floating body to the bit line by maintaining the bit line at the second constant voltage level and raising the sensing line to a half of second constant voltage level, while maintaining the bias of the word line and the bottom line at the second constant voltage level.

Herein, the method can further comprise, after the data write process, a second data hold process holding the write data by biasing the word line and the bottom word line at the negative voltage level. And, the write data may be digital logic 0 or 1.

According to the present invention, there is provided a driving circuit of an 1-transistor type DRAM having a double data structure comprising: a transistor storing data on a floating body; a word line formed on the upper side of the transistor and controlling the transistor; a bottom word line formed on the lower side of the transistor and controlling the transistor; a sensing line connected to the floating body of the transistor; a bit line connected to the floating body; a bit line connected to the floating body; a sense amp sensing data on the bit line to distinguish multi-level data; and a write driver connected to the sense amp and supplying a plurality of driving voltages to the sense amp.

Herein, the multi-level data may be data with different levels driven using a 4-level current.

And, the plurality of driving voltages can be generated using a plurality of reference voltages.

According to the present invention, there is provided a driving method of an 1-transistor type DRAM having a double data structure comprising: a data hold process biasing a word line and a bottom line at a negative voltage level and biasing a sensing line and a bit line at a first constant voltage level; a data purging process resetting data by biasing the word line and the bottom word line at a first constant voltage level and biasing the sensing line and the bit line at the first constant voltage level; and a data write process biasing the word line and the bottom word line at the second constant voltage level and supplying multi-level data to the bit line using a plurality of multi-level voltages driven by a write driver.

Herein, the method can further comprise, after the data write process, a second data hold process holding the write data by biasing the word line and the bottom word line at the negative voltage level. And, the write data may be the data with different levels driven using a 4-level current.

According to the present invention, there is provided a DRAM cell comprising: a silicon substrate; a gate formed on the silicon substrate; a first junction region formed within the silicon substrate on one side of the gate; a second junction region formed within the silicon substrate on other side of the gate; a bottom gate formed to be overlapped with the gate within the silicon substrate below the first and second junction regions; a source line formed to contact the first junction region; and a bit line formed to contact the second junction region.

Herein, the bottom gate can be formed to be surrounded by an isolating layer.

And, the bottom gate can be formed to have a larger width than the gate.

And, the substrate body formed with the gate can be floated.

And, the first junction region can be connected to the substrate bulk.

And, a first interlayer dielectric layer can be interposed between the gate and the source line.

And, the source line can be contacted to the first junction region through a first contact plug.

And, a second interlayer dielectric layer can be interposed between the source line and the bit line.

And, the bit line can be contacted to the second junction region through a second contact plug.

According to the present invention, there is provided a DRAM device comprising: a silicon substrate; a plurality of gates formed on the silicon substrate with an equal space; a plurality of first and second junction regions formed within the silicon substrate between the gates; a plurality of bottom gates formed to be overlapped with each gate within the silicon substrate below the first and second junction regions; a plurality of source lines formed to contact the first junction regions, respectively; and a plurality of bit lines formed to contact the second junction regions.

Herein, the second gate can be formed to be surrounded by an isolating layer.

And, the bottom gate can be formed to have a larger width than the gate.

And, the substrate body formed with the gate can be floated.

And, the first junction region can be connected to the substrate bulk.

And, a first interlayer dielectric layer can be interposed between the gate and the source line.

And, the source line can be contacted to the first junction region through a first contact plug.

And, the source line including the first contact plug can be shared between the neighboring unit cells.

And, a second interlayer dielectric layer can be interposed between the source line and the bit line.

And, the bit line can be contacted to the second junction region through a second contact plug.

And, the second contact plug can be shared between the neighboring unit cells.

According to the present invention, there is provided a manufacturing method for a DRAM device comprising the steps of: forming a reverse-T type first grooves defining a T-type silicon regions by etching the silicon substrate; forming a first isolating layer on the silicon surface on which the reverse-T type first grooves are formed; forming bottom gates within both sides of the reverse-T type first grooves formed with the first isolating layer, respectively; burying a second isolating layer within the reverse-T type portion where the bottom gate is not formed; forming a second groove by removing the first isolating layer on the surface of the T type silicon region and removing the first and second isolating layers buried between the T type silicon regions; burying the silicon within the second groove; forming a plurality of gates each overlapped with the respective bottom gates on the T type silicon regions; forming first and second junction regions within the T type silicon region at both sides of the respective gates, including the silicon buried within the second groove; forming a plurality of source lines each contacted to the first junction regions; and forming bit lines contacted to the second junction regions.

Herein, the first and second junction regions can be formed by implanting high-concentration impurity ion into the T type silicon region, including the silicon buried within the second groove.

And, the step forming the bottom gate can comprise burying a conductive layer within the reverse-T type first groove; and etching a portion of the buried conductive layer.

And, the first junction region can be formed to be connected to the substrate bulk.

And, the removal the first and second isolating layer on the surface of the T type silicon region and buried between the T type silicone regions can be performed by means of an etch back.

And, the source line and bit line can be formed to be shared between the neighboring unit cells.

And, the step of forming the source line contacted to the junction region can comprise: forming a first interlayer dielectric layer on the silicon substrate to cover the gates; forming a first contact hole exposing the first junction region by etching the first interlayer dielectric layer; forming a first contact plug within the first contact hole; and forming a source line on the first interlayer dielectric layer.

And, the source line including the first contact plug can be formed to be shared between the neighboring DRAM cells.

And, the step of forming the bit line contacted to the first junction region can comprise: forming a first interlayer dielectric layer on the silicon substrate to cover the gates; forming a second interlayer dielectric layer on the first interlayer dielectric layer; forming a second contact hole to expose the second junction region by etching the second and first interlayer dielectric layers; forming a second contact plug within the second contact hole; and forming a bit line on the second interlayer dielectric layer.

And, the second contact plug can be formed to be shared between the neighboring unit cells.

DESCRIPTION OF SPECIFIC EMBODIMENTS

Hereinafter, preferred embodiments of the present invention will be described in detail with reference to the accompanying drawings.

Figure 1:
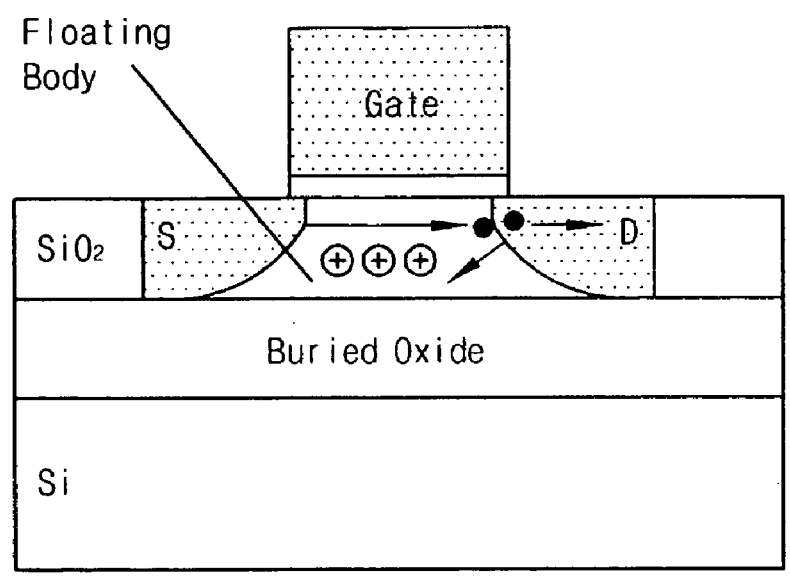
FIG. 1 is a cross-sectional view showing a cross section constitution of a unit cell structure of an 1-transistor type DRAM according to the prior art.
Figure 2:
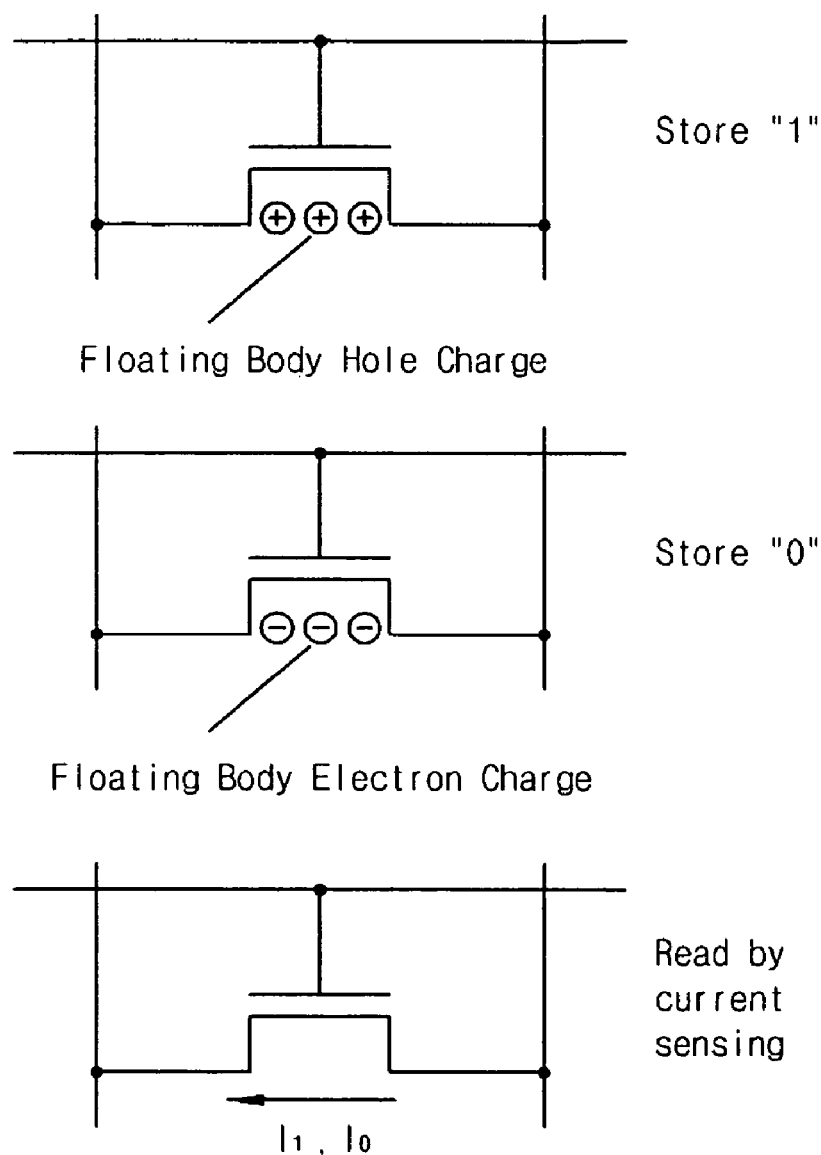
FIG. 2 is a view showing a flow process of a read current a cell data storing state of the 1-transistor DRAM according to the prior art.
Figure 3:
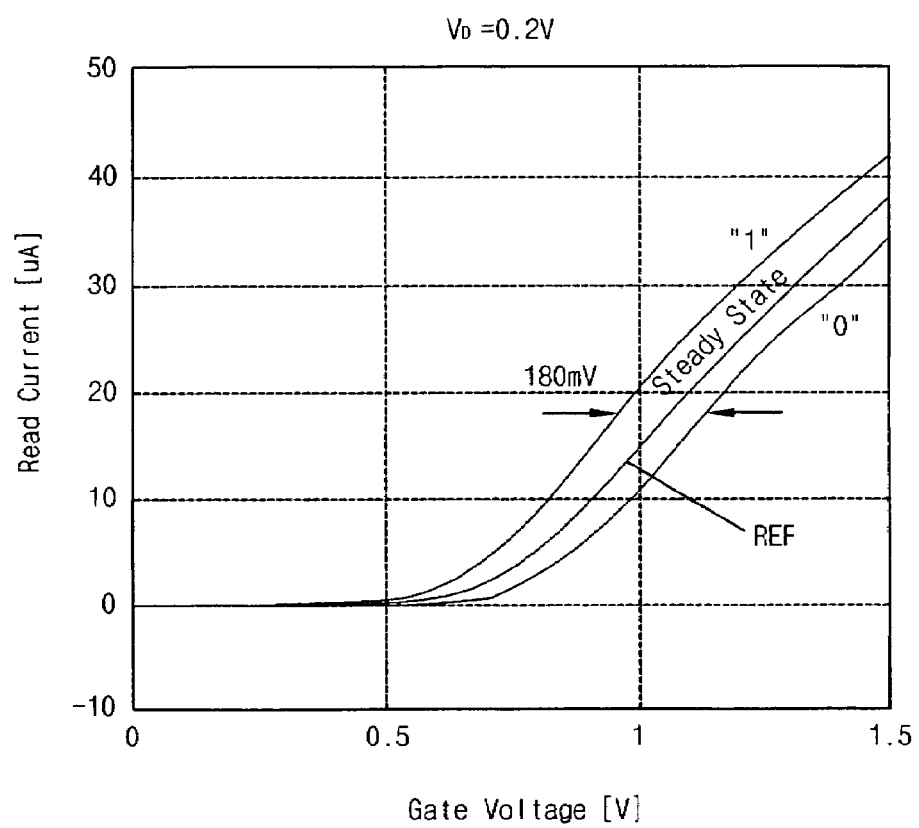
FIG. 3 is a waveform view showing waveform characteristics of a cell read current of the 1-transistor type DRAM according to the prior art.
Figure 4:
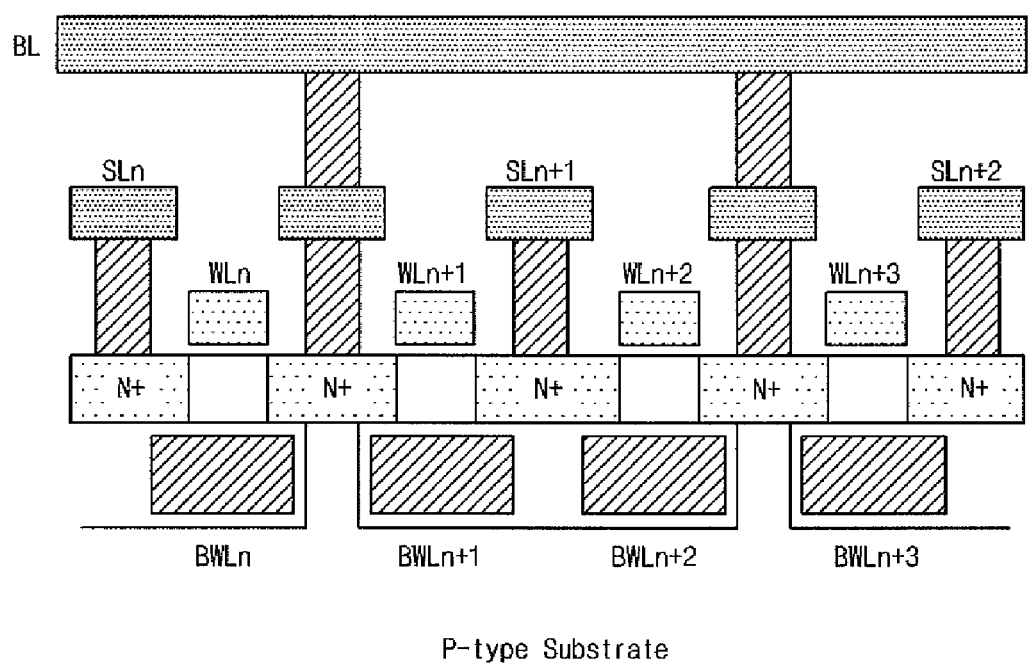
FIG. 4 is a cross-sectional view showing a double gate cell structure according to the present invention.

FIG. 4 is a cross-sectional view schematically showing a double gate cell structure according to the present invention. The concrete constitution thereof will be described with reference to FIGS. 23 and 24 described below.

Figure 5:
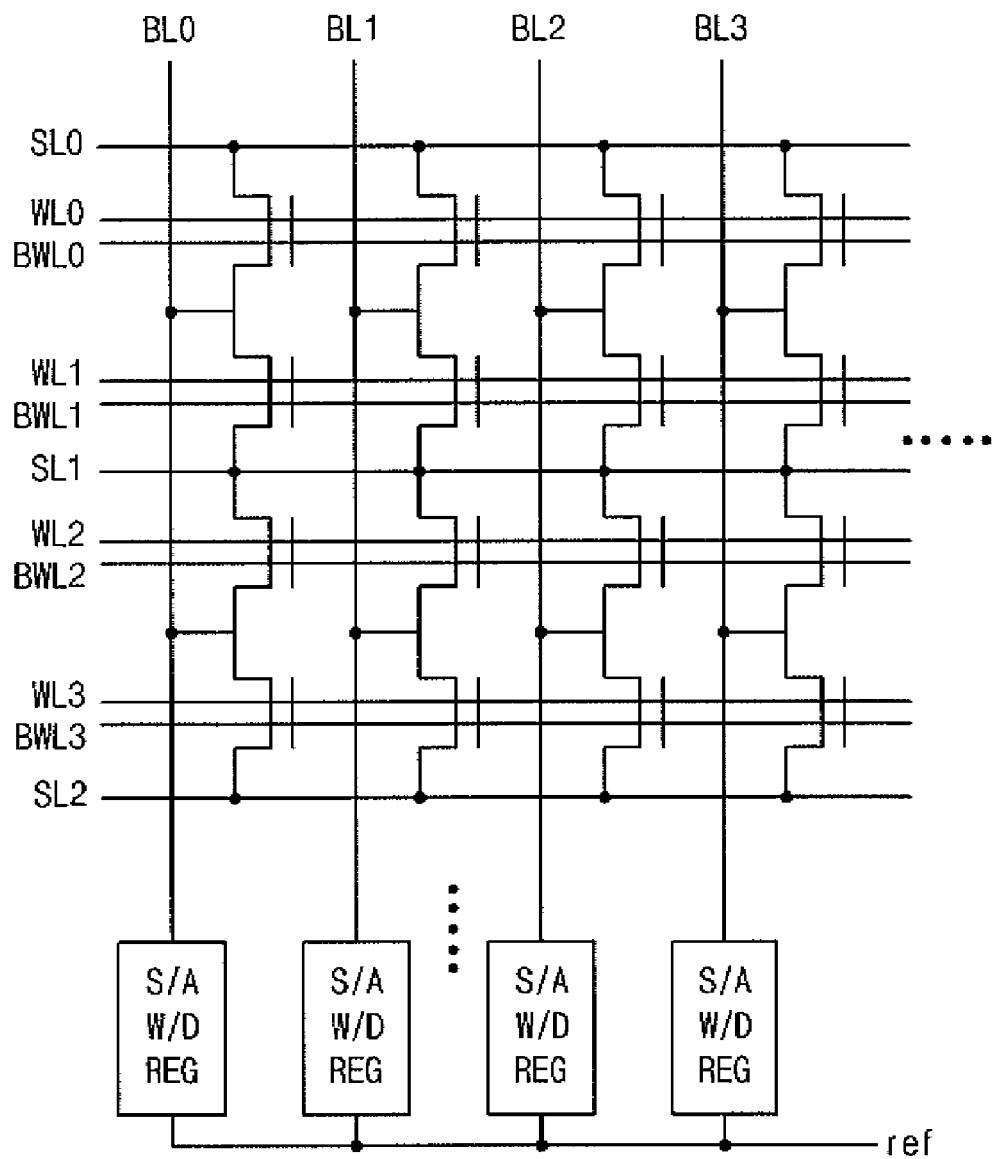
FIG. 5 is a circuit diagram showing a double gate cell array structure according to the present invention.

FIG. 5 is a circuit diagram showing a double gate cell array structure according to the present invention. As shown, each of two cells has a structure to share a bit line contact (BL Contact) and a sensing line contact (SL contact). And, word lines WL0, . . . , WL3, bottom word lines BWL0, . . . , BWL3, and sensing lines SL0, . . . , SL2 are arranged in a row direction and bit lines BL0, . . . , BL3 is arranged in a column direction. And each of the bit lines BL0, . . . , BL3 includes a sense amp (S/A), a write driver (W/D), and a register block (REG), wherein these circuits is supplied with a reference voltage (ref).

In FIG. 5, the sense amp is a circuit operated for distinguishing data 1 from data 0 by sensing cell data the sense amp (S/A). And, the register block (REG) is a temporary memory circuit temporarily storing the data of the sense amp S/A. And, the write driver W/D is a circuit generating driving voltage in the bit lines according to the write data when writing data in the cell.

A driving method for an 1-transistor type DRMA according to the present invention will be described.

Figure 6:
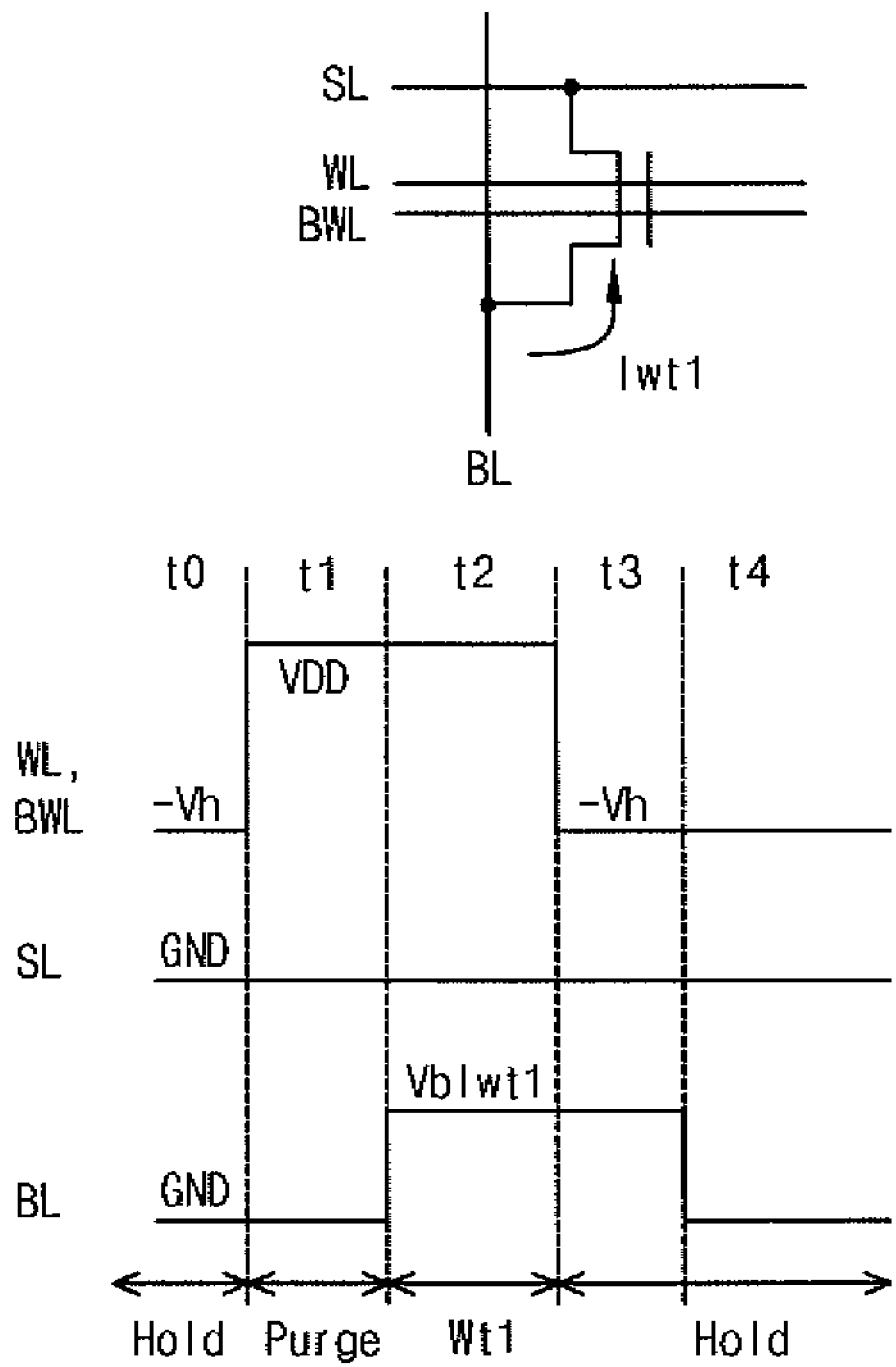
FIG. 6 is a view showing one embodiment of a driving method according to the present invention.

FIG. 6 shows a method writing the data 1 according to the present invention. In FIG. 6, t0, t3, and t4 are hold periods maintaining data. And, t1 is a purge period resetting and initializing cell data and this is an important driving method of the 1-transistor type DRAM according to the present invention. t2 is a period writing the data "1".

Concretely describing, if in the to period, the word line WL=−Vh, the bottom word line BWL=−Vh, the sensing line SL=GND and the bit line BL=GND, the data of the floating body is maintained. Preferably, each of the word line WL and the bottom word line BWL is maintained at a negative voltage such as −Vh.

And, if in the to period, the word line WL=VDD, the bottom word line BWL=VDD, the sensing line SL=GND and the bit line BL=GND, the voltage of the floating body is raised by means of coupling capacitance between the word line WL and the floating body data. Therefore, all the holes of the floating body escape to the sensing line SL and the bit line BL. Thereby, the floating body is reset to be an initial state, performing a purge operation.

Next, if in the t2 period, the word line WL=VDD, the bottom word line BWL=VDD, the sensing line SL=GND and the bit line BL=Vb1$wt$1, Write 1 current, that is, Iwt1 flows from the bit line BL to the sensing line SL. At this time, a number of holes are generated and these holes are captured in the floating body. The voltage of the captured hole is lower than the Vb1$wt$1. Therefore, the hole of logic-high voltage is stored in the floating body.

Next, if in the t3 period, WL=−Vh, the bottom word line BWL=−Vh, the sensing line SL=GND, and the bit line BL=Vb1$wt$1, the voltage of the word line WL drops to −Vh level, which is a negative hold voltage, so that the holes of logic-high voltage stored in the floating body become a low voltage state.

Finally, if in the t4 period, the word line WL=−Vh, the bottom word line BWL=−Vh, the sensing line SL=GND, and the bit line BL=GND, the voltage of the hole stored in the floating body is maintained at a lower state than the ground GND.

Figure 7:
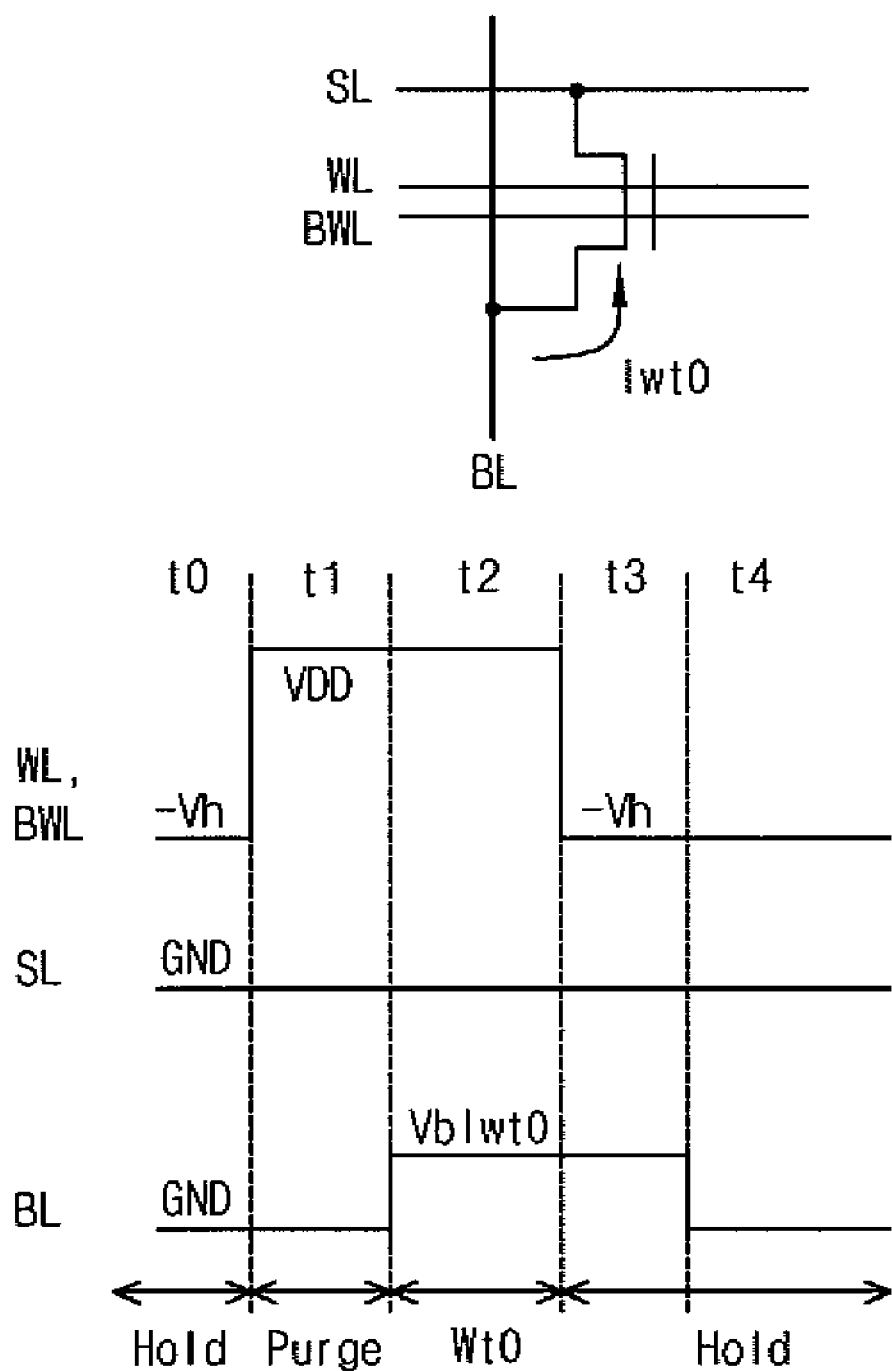
FIG. 7 is a view showing other embodiment of a driving method according to the present invention.

FIG. 7 is other embodiment of a driving method according to the present invention and shows a method to write a data "0". In FIG. 7, t0, t3, and t4 are hold periods maintaining data. And, t1 is a purge period resetting and initializing the cell data and this is an important driving method of the 1-transistor type DRAM. t2 is a period writing the data "0".

Concretely describing it, if in the t0 period, the word line WL=−Vh, the bottom word line BWL=−Vh, the sensing line SL=GND and the bit line BL=GND, the data of the floating body is maintained. Preferably, each of the word line WL and the bottom word line BWL is maintained at a negative voltage such as −Vh.

And, if in the t1 period, the word line WL=VDD, the bottom word line BWL=VDD, the sensing line SL=GND and the bit line BL=GND, the voltage of the floating body is raised by means of coupling capacitance between the word line WL and the floating body data. Therefore, all the holes of the floating body escape to the sensing line SL and the bit line BL. Thereby, the floating body is reset to be an initial state, performing a purge operation.

Next, if in the t2 period, the word line WL=VDD, the bottom word line BWL=VDD, the sensing line SL=GND and the bit line BL=Vb1$wt$0, Write 0 current, that is, Iwt0 flows from the bit line BL to the sensing line SL.

At this time, when comparing with the Vb1$wt$1 of FIG. 6, the Vb1$wt$0 voltage is relatively low so that a few holes are generated and these holes are captured in the floating body. The voltage of the captured hole is lower than the Vb1$wt$0. Therefore, the hole of low voltage is stored in the floating body.

Next, if in the t3 period, the word line WL=−Vh, the bottom word line BWL=−Vh, the sensing line SL=GND, and the bit line BL=Vb1$wt$0, the voltage of the word line WL drops to −Vh level, which is a negative hold voltage, so that the holes of logic-high voltage stored in the floating body become a low voltage state.

Finally, if in the t4 period, the word line WL=−Vh, the bottom word line BWL=−Vh, the sensing line SL=GND, and the bit line BL=GND, the voltage of the hole stored in the floating body is maintained at a lower state than the ground GND.

Figure 8:
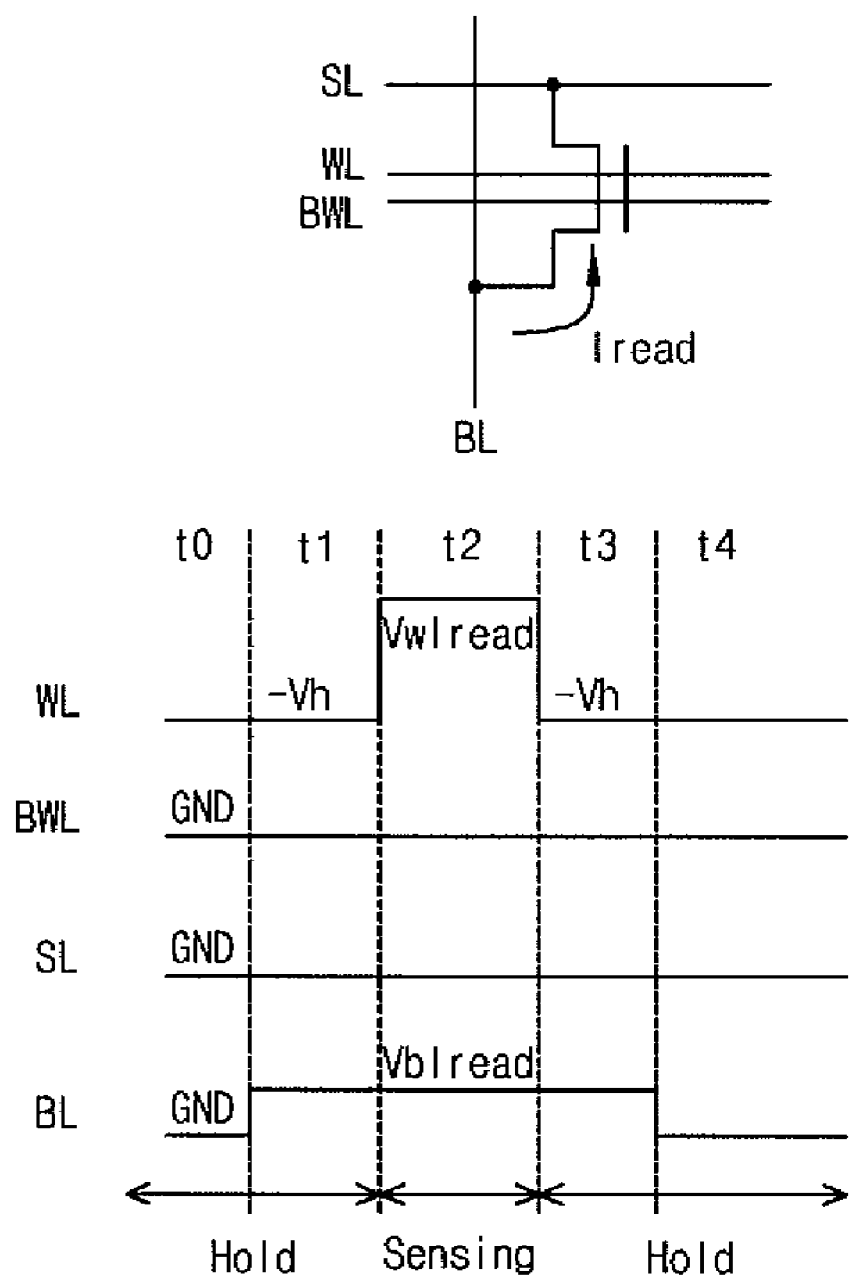
FIG. 8 is a view showing another embodiment of a driving method according to the present invention.

FIG. 8 shows a read method as a driving method according to the present, invention. In FIG. 8, t0, t1, t3, and t4 periods are hold periods maintaining data, and t2 is a period performing a read operation.

Concretely describing it, if in the t0 period, the word line WL=−Vh, the bottom word line BWL=GND, the sensing line SL=GND and the bit line BL=GND, the data of the floating body is maintained.

The t1 period is a period applying a read voltage Vb1read to the bit line BL in order to sense the read current.

If in the t2 period, WL=Vw1read, the bottom word line BWL=GND, the sensing line SL=GND, and the bit line BL=Vb1read, the read current flows from the bit line BL to the sensing line SL. At this time, if the amount of sensing current is larger than reference current, the data is 1 and if it is lower than the reference current, the data is 0.

IF in the t3 period, the word line WL=−Vh, the bottom word line BWL=GND, the sensing line SL=GND and the bit line BL=Vb1read, the read current stops.

If in the t4 period, the word line WL=−Vh, the bottom word line BWL=GND, the sensing line SL=GND, and the BL=GND, the voltage of hole stored in the floating body is maintained at a lower state than the ground GND.

Figure 9:
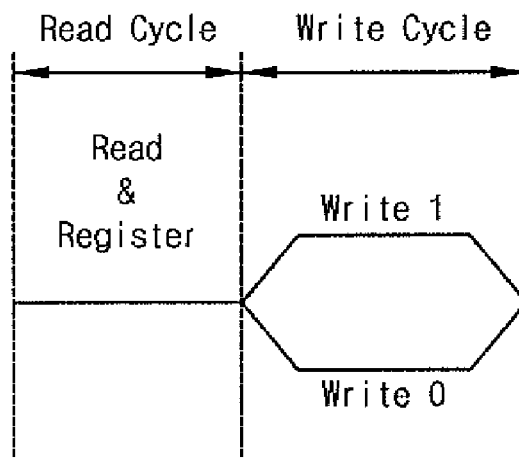
FIG. 9 is a view showing one example of a write process of an 1-transistor type DRAM according to the present invention.

FIG. 9 is a view showing one example of a write process of an 1-transistor type DRAM according to the present invention.

As shown, the write process includes a read cycle and a write cycle. In the read cycle period, cell data are sensed and amplified for all the cells in a row selected and then, are stored in the register. And, in the write cycle, the data stored in the resister are back written to be restored. Meanwhile, cells to be newly written are written with new external data. At this time, the new external data can be stored by clearing and resetting the data previously stored in the register.

Figure 10:
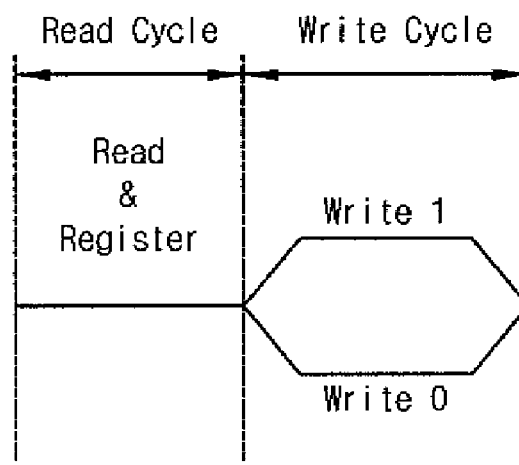
FIG. 10 is a view showing one example of a refresh process of the 1-transistor type DRAM according to the present invention.

FIG. 10 is a view showing a refresh method of the 1-transistor type DRAM according to the present invention. The refresh method can be performed through the read cycle and the write cycle. That is, in the read cycle period, cell data are sensed and amplified for all the cells in a row selected and then, are stored in the register. Thereafter, in the write cycle, the data stored in the resister are back written, making it possible to perform the refresh. According to the present invention as above, the refresh can be realized by means of the write operation.

Meanwhile, the present invention can be realized on the bulk silicon substrate and also on the SOI substrate.

Figure 11:
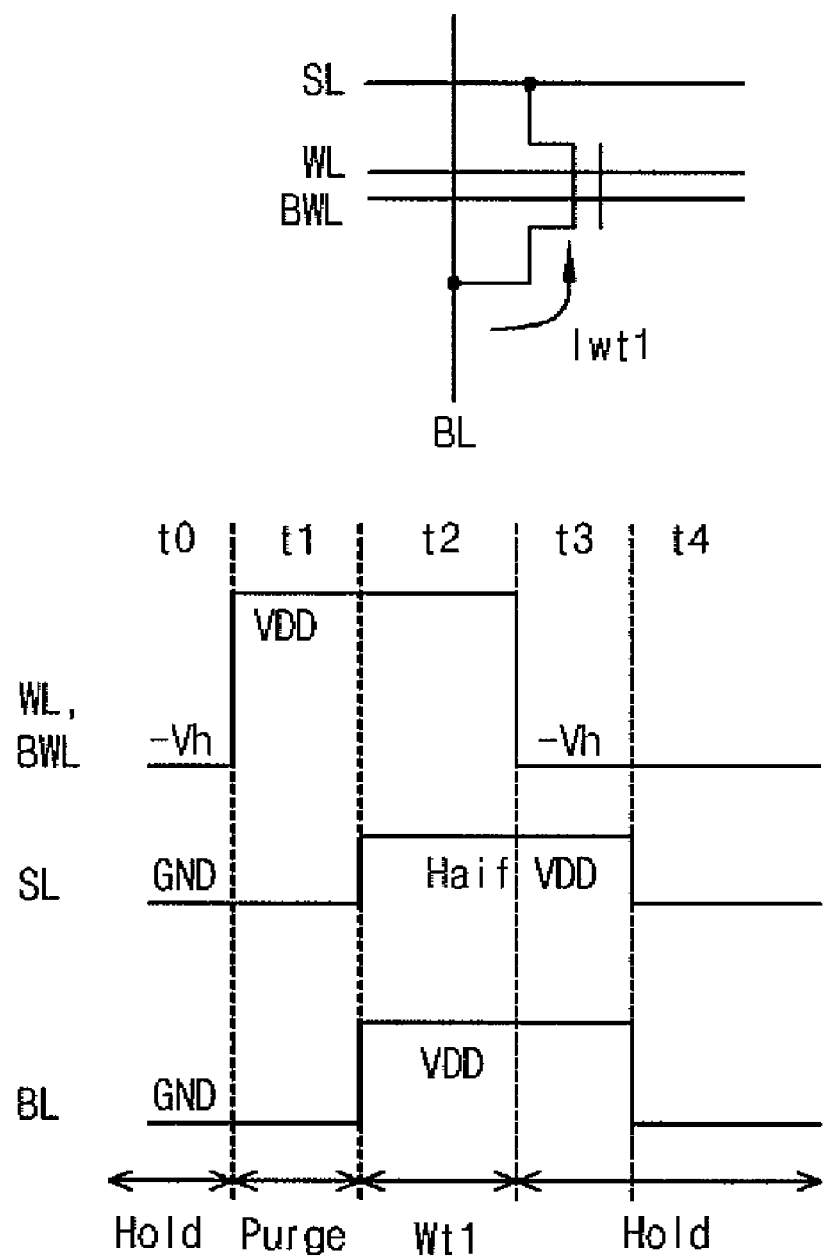
FIGS. 11 to 13 are views showing view showing an embodiment of other driving method according to the present invention.
Figure 12:
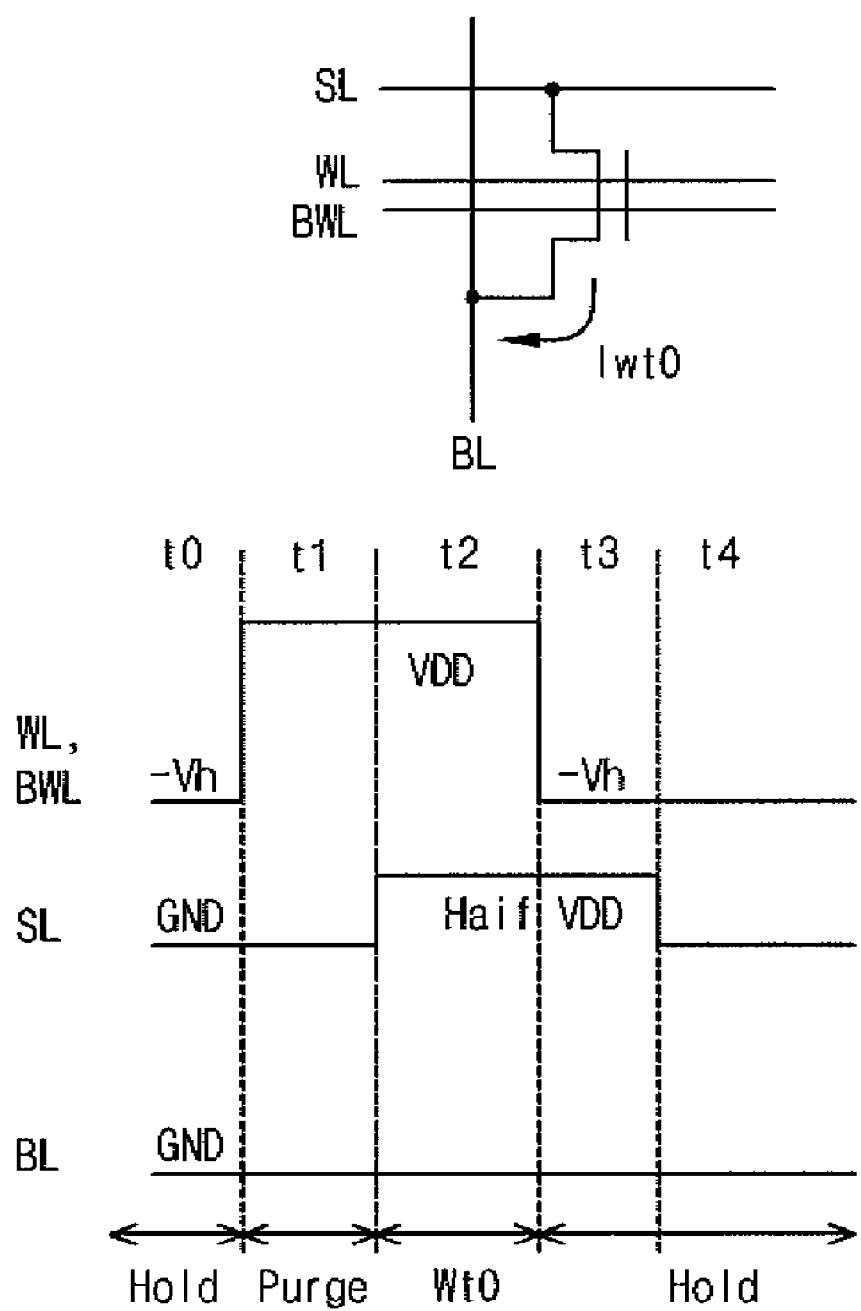
Figure 13:
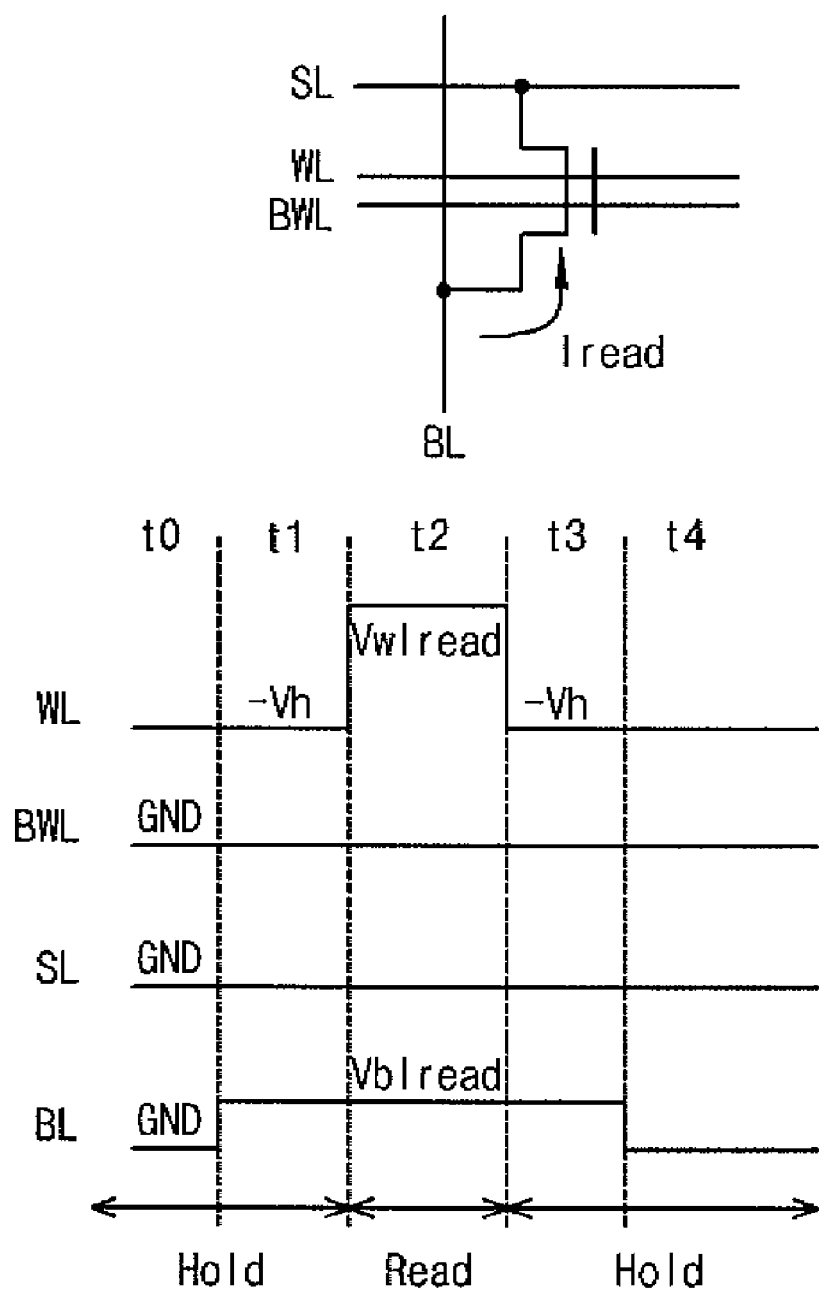

The DRAM according to the present invention can be driven as in FIGS. 11 to 13.

FIG. 11 is a method writing the data 1 according to the present invention. In FIG. 11, t0, t3, and t4 periods are hold periods maintaining data. And, t1 is a purge period resetting and initializing the cell data. and this is an important driving method of the 1-transistor type DRAM according to the present invention. t2 is a period writing the data "1".

Concretely describing it, if in the to period, the word line WL=−Vh, the bottom word line BWL=−Vh, the sensing line SL=GND and the bit line BL=GND, the data of the floating body is maintained. Preferably, each of the word line WL and the bottom word line BWL is maintained at a negative voltage such as −Vh.

And, if in the to period, the word line WL=VDD, the bottom word line BWL=VDD, the sensing line SL=GND and the bit line BL=GND, the voltage of the floating body is raised by means of coupling capacitance between the word line WL and the floating body data. Therefore, all the holes of the floating body escape to the sensing line SL and the bit line BL. Thereby, the floating body is reset to be an initial state, performing a purge operation.

Next, if in the t2 period, the word line WL=VDD, the bottom word line BWL=VDD, the sensing line SL=Half VDD and the bit line BL=VDD, Write 1 current, that is, Iwt1 flows from the bit line BL to the sensing line SL. At this time, a number of holes are generated and these holes are captured in the floating body. The voltage of the captured hole is higher than the Half VDD voltage and is lower than VDD voltage. Therefore, the hole of logic-high voltage is stored in the floating body.

Next, if in the t3 period, the word line WL=−Vh, the bottom word line BWL=−Vh, the sensing line SL=HalfVDD, and the bit line BL=VDD, the voltage of the word line WL drops to −Vh level, which is a negative hold voltage, so that the holes of logic-high voltage stored in the floating body become a low voltage state.

Finally, if in the t4 period, the word line WL=−Vh, the bottom word line BWL=−Vh, the sensing line SL=GND, and the bit line BL=GND, the voltage of the hole stored in the floating body is maintained at a lower state than the ground GND.

FIG. 12 is other embodiment of a driving method according to the present invention and shows a method to write a data "0". In FIG. 7, t0, t3, and t4 are hold periods maintaining data. And, t1 is a purge period resetting and initializing the cell data and this is an important driving method of the 1-transistor type DRAM. t2 is a period writing the data "0".

Concretely describing it, if in the to period, the word line WL=−Vh, the bottom word line BWL=−Vh, the sensing line SL=GND and the bit line BL=GND, the data of the floating body is maintained. Preferably, each of the word line WL and the bottom word line BWL is maintained at a negative voltage such as −Vh.

And, if in the t1 period, the word line WL=VDD, the bottom word line BWL=VDD, the sensing line SL=GND and the bit line BL=GND, the voltage of the floating body is raised by means of coupling capacitance between the word line WL and the floating body data. Therefore, all the holes of the floating body escape to the sensing line SL and the bit line BL. Thereby, the floating body is reset to be an initial state, performing a purge operation.

Next, if in the t2 period, the word line WL=VDD, the bottom word line BWL=VDD, the sensing line SL=Half VDD and the bit line BL=GND, Write 0 current, that is, Iwt0 flows from the bit line BL to the sensing line SL. At this time, the flowing current direction is opposite to the Write 1.

At this time, a few holes are generated and these holes are captured in the floating body. The voltage of the captured hole is higher than the GND voltage and is lower than the Half VDD voltage. Therefore, the hole of low voltage is stored in the floating body.

Next, if in the t3 period, the word line WL=−Vh, the bottom word line BWL=−Vh, the sensing line SL=HalfVDD, and the bit line BL=GND, the voltage of the word line WL drops to −Vh level, which is a negative hold voltage, so that the holes of logic-high voltage stored in the floating body become a low voltage state.

Finally, if in the t4 period, the word line WL=−Vh, the bottom word line BWL=−Vh, the sensing line SL=GND, and the bit line BL=GND, the voltage of the hole stored in the floating body is maintained at a lower state than the ground GND.

FIG. 13 shows a read method as a driving method according to the present invention. In FIG. 8, t0, t1, t3, and t4 periods are hold periods maintaining data, and t2 is a period performing a read operation.

Concretly describing it, if in the t0 period, the word line WL=−Vh, the bottom word line BWL=GND, the sensing line SL=GND and the bit line BL=GND, the data of the floating body is maintained.

The t1 period is a period applying a read voltage Vb1read to the bit line BL in order to sense the read current.

If in the t2 period, WL=Vw1read, the bottom word line BWL=GND, the sensing line SL=GND, and the bit line BL=Vb1read, the read current flows from the bit line BL to the sensing line SL. At this time, if the amount of flowed sensing current is larger than reference current, the data is 1 and if it is lower than the reference current, the data is 0.

IF in the t3 period, the word line WL=−Vh, the bottom word line BWL=GND, the sensing line SL=GND and the bit line BL=Vb1read, the read current stops.

If in the t4 period, the word line WL=−Vh, the bottom word line BWL=GND, the sensing line SL=GND, and the BL=GND, the voltage of hole stored in the floating body is maintained at a lower state than the ground GND.

Figure 14:
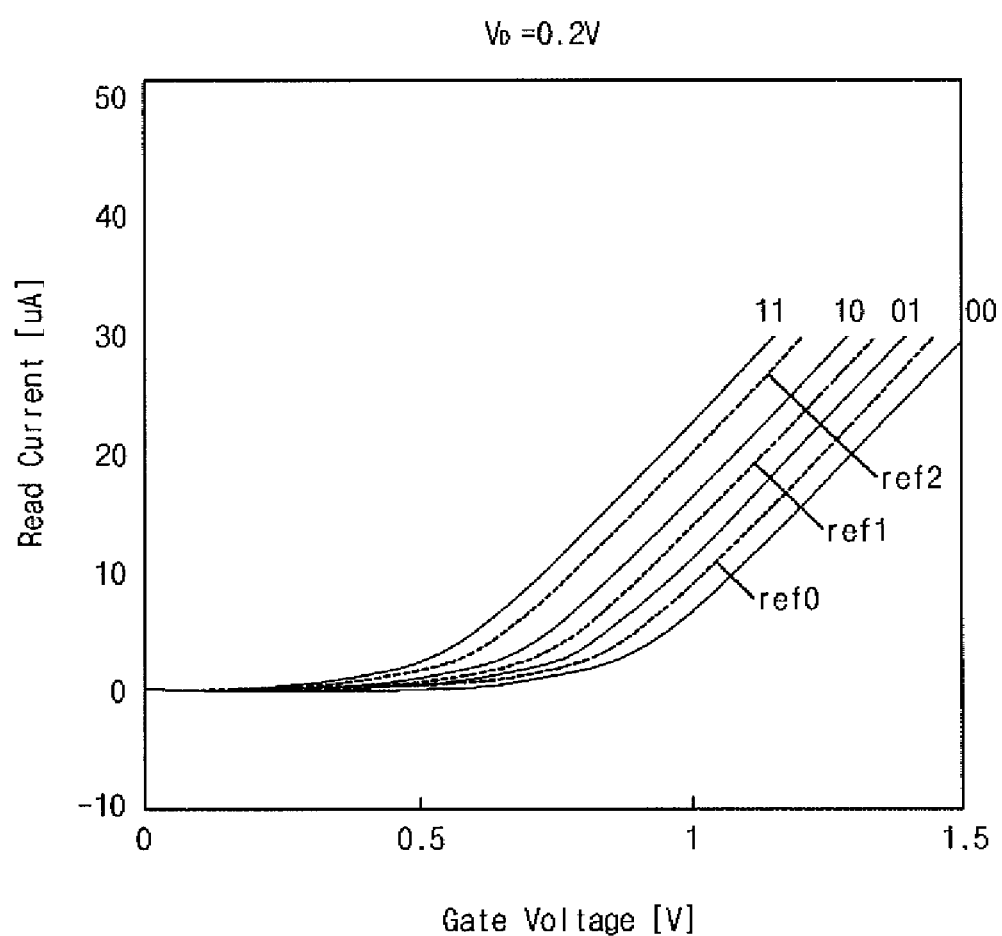
FIG. 14 is a waveform view showing waveform characteristics of a read current in a multi level driving according to the present invention.

The present invention can be driven at a multi-level. FIG. 14 is one example of a multi level driving according to the present invention and shows a waveform of 4-level 2-bit cell read current. In the case where a cell drain voltage Vd=0.2V and a cell source voltage are a ground GND, the cell read current when the cell gate voltage is swept is assumed. As a method operating 2-bit using the 4-level current, the highest level is data 11, the next lower level is data 10, the next second lower level is data 01, and the lowest level is data 00. The respective reference voltages REF2, REF1, and REF0 are positioned between each 4-level so that a multiple bit read operation can be performed.

A driving method of an 1-transistor DRAM according to the present invention will be described.

Figure 15:
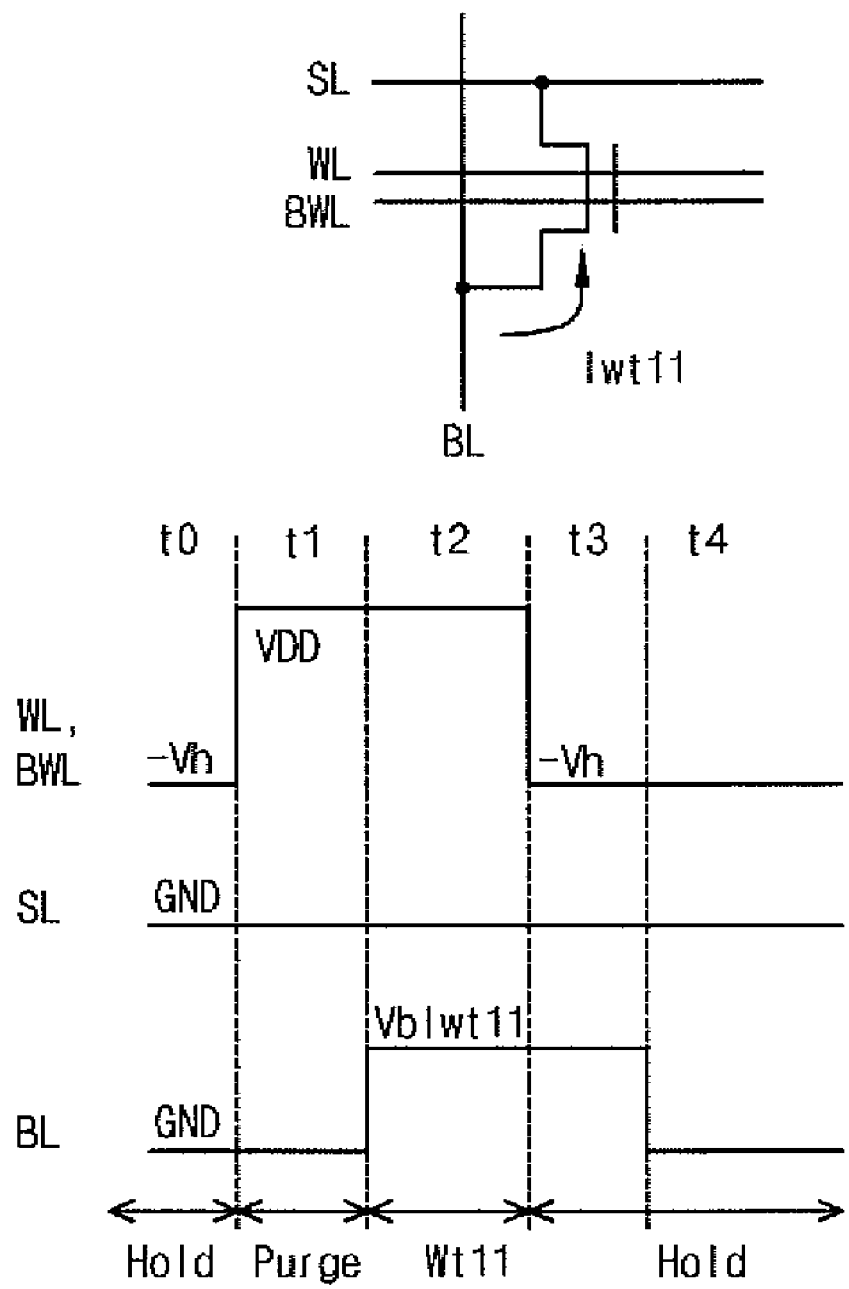
FIG. 15 is a view showing an embodiment of a more significant bit driving method of FIG. 14.
Figure 16:
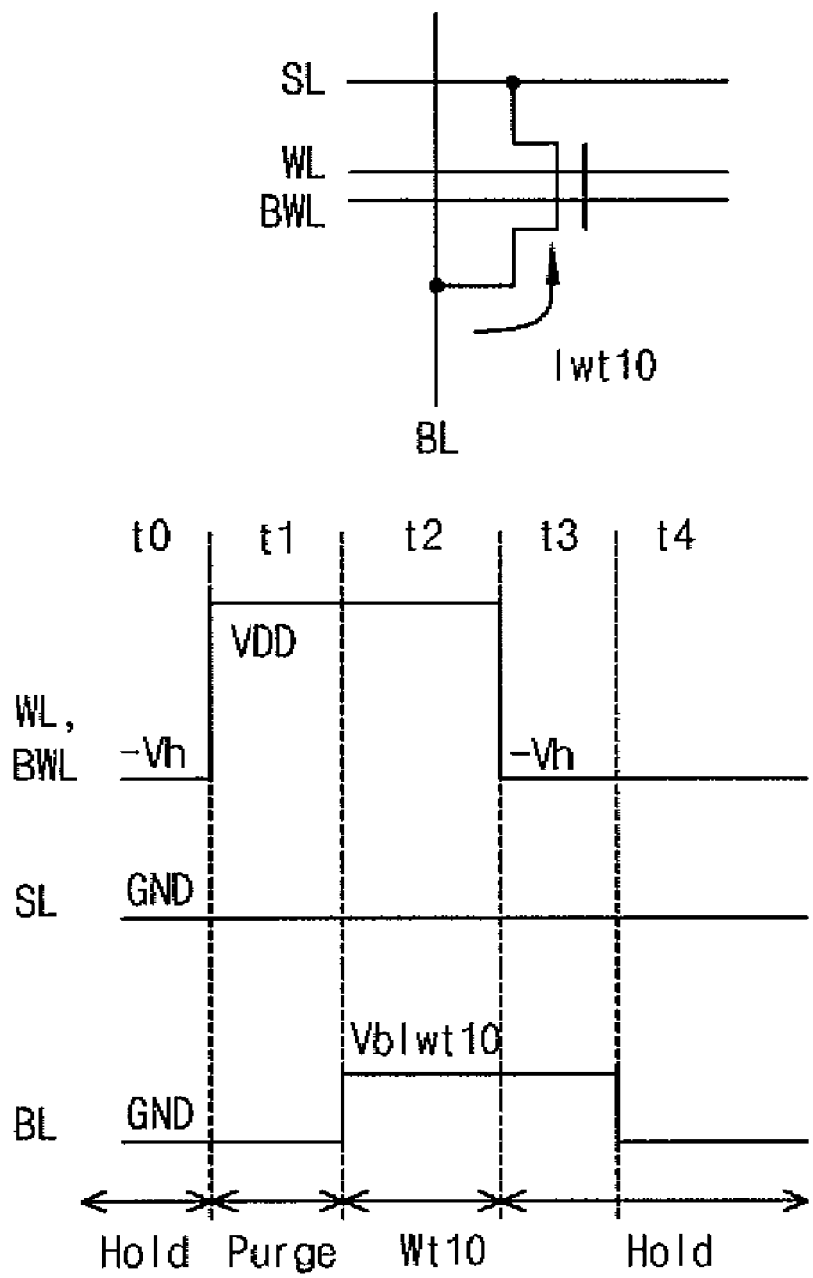
FIG. 16 is a view showing an embodiment of a second more significant bit driving method of FIG. 14.

FIG. 15 shows a method writing the data 1 according to the present invention. In FIG. 16, t0, t3, and t4 periods are hold periods maintaining data. And, t1 is a purge period resetting and initializing the cell data and this is an important driving method of the 1-transistor type DRAM. t2 is a period writing the data "11".

Concretely describing it, if in the t0 period, the word line WL=−Vh, the bottom word line BWL=−Vh, the sensing line SL=GND and the bit line BL=GND, the data of the floating body is maintained. Preferably, each of the word line WL and the bottom word line BWL is maintained at a negative voltage such as −Vh.

And, if in the t1 period, the word line WL=VDD, the bottom word line BWL=VDD, the sensing line SL=GND and the bit line BL=GND, the voltage of the floating body is raised by means of coupling capacitance between the word line WL and the floating body data. Therefore, all the holes of the floating body escape to the sensing line SL and the bit line BL. Thereby, the floating body is reset to be an initial state, performing a purge operation.

Next, if in the t2 period, the word line WL=VDD, the bottom word line BWL=VDD, the sensing line SL=GND and the bit line BL=Vb1*wt*11, Write 11 current, that is, Iwt11 flows from the bit line BL to the sensing line SL. At this time, a number of holes are generated and these holes are captured in the floating body. The voltage of the captured hole is lower than the Vb1*wt*11. Therefore, the hole of logic-high voltage is stored in the floating body.

Next, if in the t3 period, the word line WL=−Vh, the bottom word line BWL=−Vh, the sensing line SL=GND, and the bit line BL=Vb1*wt*11, the voltage of the word line WL drops to −Vh level, which is a negative hold voltage, so that the holes of logic-high voltage stored in the floating body become a low voltage state.

Finally, if in the t4 period, the word line WL=−Vh, the bottom word line BWL=−Vh, the sensing line SL=GND, and the bit line BL=GND, the voltage of the hole stored in the floating body is maintained at a lower state than the ground GND.

FIG. 16 shows a method writing the data "10" according to the present invention. In FIG. 16, t0, t3, and t4 periods are hold periods maintaining data. And, t1 is a purge period resetting and initializing the cell data and this is an important driving method of the 1-transistor type DRAM. t2 is a period writing the data "10".

Concretely describing it, if in the to period, the word line WL=−Vh, the bottom word line BWL=−Vh, the sensing line SL=GND and the bit line BL=GND, the data of the floating body is maintained. Preferably, each of the word line WL and the bottom word line BWL is maintained at a negative voltage such as −Vh.

And, if in the t1 period, the word line WL=VDD, the bottom word line BWL=VDD, the sensing line SL=GND and the bit line BL=GND, the voltage of the floating body is raised by means of coupling capacitance between the word line WL and the floating body data. Therefore, all the holes of the floating body escape to the sensing line SL and the bit line BL. Thereby, the floating body is reset to be an initial state, performing a purge operation.

Next, if in the t2 period, the word line WL=VDD, the bottom word line BWL=VDD, the sensing line SL=GND and the bit line BL=Vb1*wt*10, Write 10 current, that is, Iwt10 flows from the bit line BL to the sensing line SL.

At this time, when comparing with the Vb1*wt*11 voltage of FIG. 15, the Vb1*wt*10 voltage is relatively low so that a fewer holes than FIG. 15 are generated and these holes are captured in the floating body. The voltage of the captured hole is lower than the Vb1*wt*0 voltage. Therefore, the hole of low voltage is stored in the floating body.

Next, if in the t3 period, the word line WL=−Vh, the bottom word line BWL=−Vh, the sensing line SL=GND, and the bit line BL=Vb1*wt*10, the voltage of the word line WL drops to −Vh level, which is a negative hold voltage, so that the holes of logic-high voltage stored in the floating body become a low voltage state.

Finally, if in the t4 period, the word line WL=−Vh, the bottom word line BWL=−Vh, the sensing line SL=GND, and the bit line BL=GND, the voltage of the hole stored in the floating body is maintained at a lower state than the ground GND.

Figure 17:
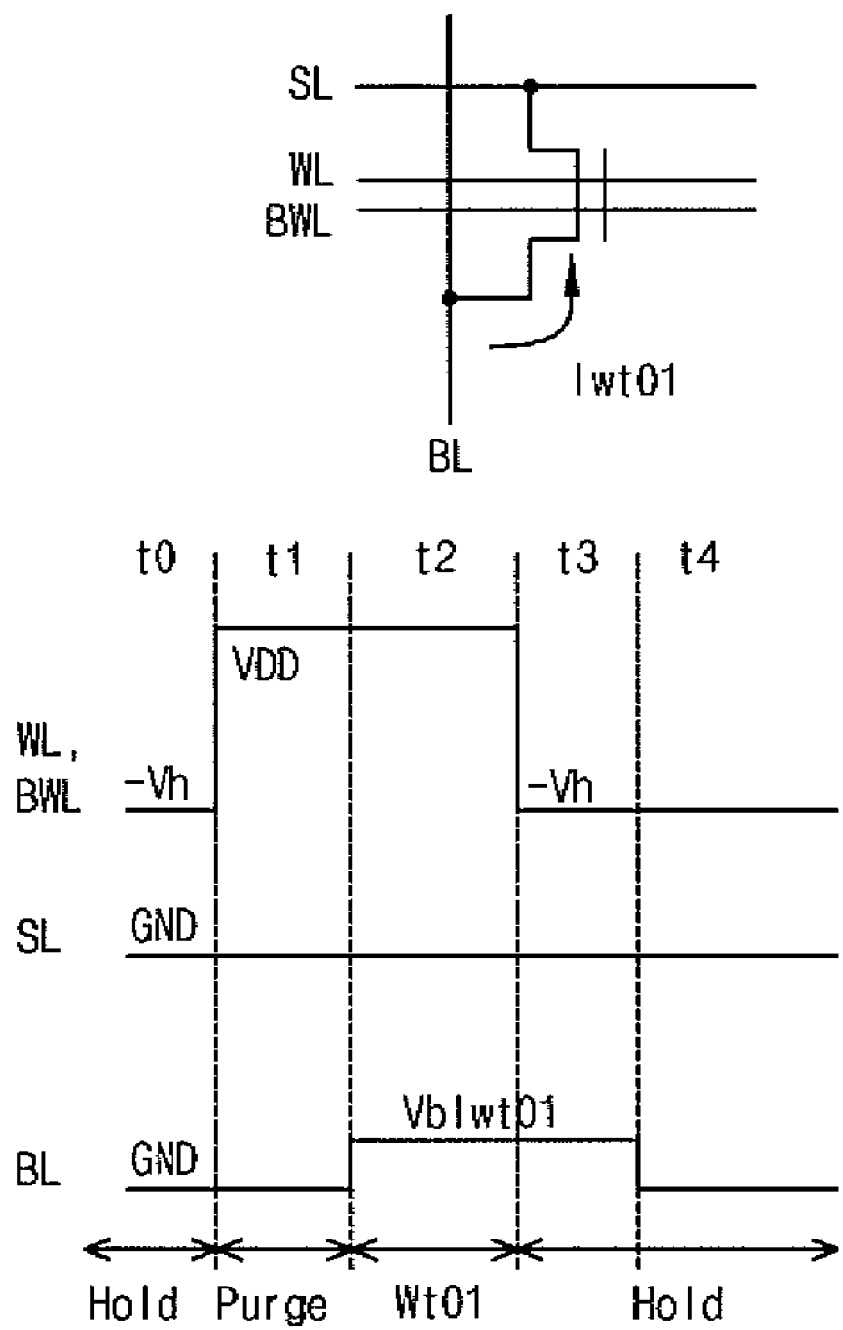
FIG. 17 is a view showing an embodiment of a next second more significant bit driving method of FIG. 14.

FIG. 17 shows a method writing the data "01" according to the present invention. In FIG. 17, t0, t3, and t4 periods are hold periods maintaining data. And, t1 is a purge period resetting and initializing the cell data and this is an important driving method of the 1-transistor type DRAM. t2 is a period writing the data "01".

Concretely describing it, if in the to period, the word line WL=−Vh, the bottom word line BWL=−Vh, the sensing line SL=GND and the bit line BL=GND, the data of the floating body is maintained. Preferably, each of the word line WL and the bottom word line BWL is maintained at a negative voltage such as −Vh.

And, if in the to period, the word line WL=VDD, the bottom word line BWL=VDD, the sensing line SL=GND and the bit line BL=GND, the voltage of the floating body is raised by means of coupling capacitance between the word line WL and the floating body data. Therefore, all the holes of the floating body escape to the sensing line SL and the bit line BL. Thereby, the floating body is reset to be an initial state, performing a purge operation.

Next, if in the t2 period, the word line WL=VDD, the bottom word line BWL=VDD, the sensing line SL=GND and the bit line BL=Vb1wt01, Write 01 current, that is, Iwt01 flows from the bit line BL to the sensing line SL.

At this time, when comparing with the Vb1wt10 of FIG. 16, the Vb1wt01 voltage is relatively low so that a fewer holes than FIG. 16 are generated and these holes are captured in the floating body. The voltage of the captured hole is lower than the Vb1wt0. Therefore, the hole of low voltage is stored in the floating body.

Next, if in the t3 period, the word line WL=−Vh, the bottom word line BWL=−Vh, the sensing line SL=GND, and the bit line BL=Vb1wt01, the voltage of the word line WL drops to −Vh level, which is a negative hold voltage, so that the holes of logic-high voltage stored in the floating body become a low voltage state.

Finally, if in the t4 period, the word line WL=−Vh, the bottom word line BWL=−Vh, the sensing line SL=GND, and the bit line BL=GND, the voltage of the hole stored in the floating body is maintained at a lower state than the ground GND.

Figure 18:
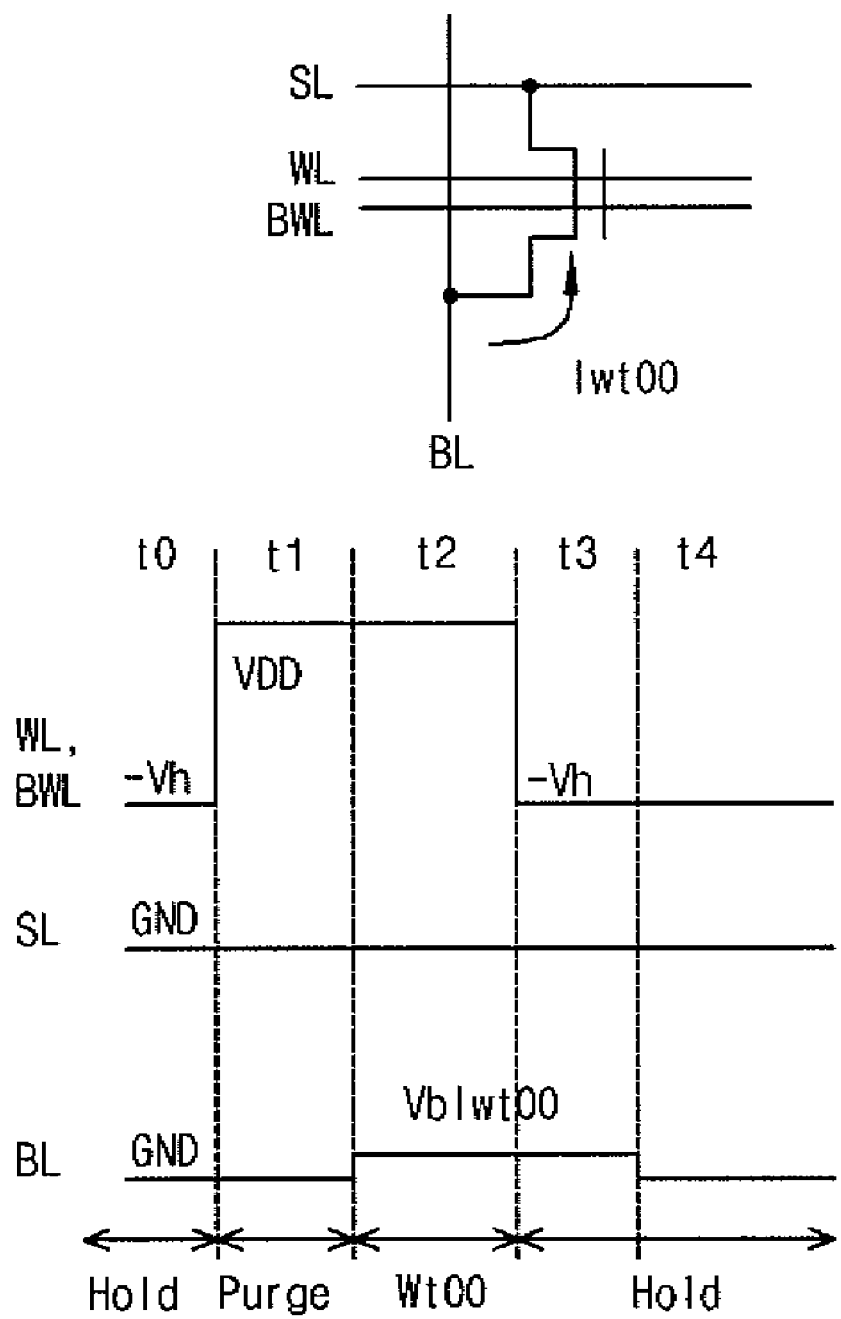
FIG. 18 is a view showing an embodiment of a less significant bit driving method of FIG. 14.

FIG. 18 shows a method writing the data "00" according to the present invention. In FIG. 18, t0, t3, and t4 periods are hold periods maintaining data. And, t1 is a purge period resetting and initializing the cell data and this is an important driving method of the 1-transistor type DRAM. t2 is a period writing the data "00".

Concretely describing it, if in the t0 period, the word line WL=−Vh, the bottom word line BWL=−Vh, the sensing line SL=GND and the bit line BL=GND, the data of the floating body is maintained. Preferably, each of the word line WL and the bottom word line BWL is maintained at a negative voltage such as −Vh.

And, if in the t1 period, the word line WL=VDD, the bottom word line BWL=VDD, the sensing line SL=GND and the bit line BL=GND, the voltage of the floating body is raised by means of coupling capacitance between the word line WL and the floating body data. Therefore, all the holes of the floating body escape to the sensing line SL and the bit line BL. Thereby, the floating body is reset to be an initial state, performing a purge operation.

Next, if in the t2 period, the word line WL=VDD, the bottom word line BWL=VDD, the sensing line SL=GND and the bit line BL=Vb1wt00, Write 00 current, that is, Iwt00 flows from the bit line BL to the sensing line SL.

At this time, when comparing with the Vb1wt01 of FIG. 16, the Vb1wt00 voltage is relatively low so that a fewer holes than FIG. 16 are generated and these holes are captured in the floating body. The voltage of the captured hole is lower than the Vb1wt0. Therefore, the hole of low voltage is stored in the floating body.

Next, if in the t3 period, the word line WL=−Vh, the bottom word line BWL=−Vh, the sensing line SL=GND, and the bit line BL=Vb1wt00, the voltage of the word line WL drops to −Vh level, which is a negative hold voltage, so that the holes of logic-high voltage stored in the floating body become a low voltage state.

Finally, if in the t4 period, the word line WL=−Vh, the bottom word line BWL=−Vh, the sensing line SL=GND, and the bit line BL=GND, the voltage of the hole stored in the floating body is maintained at a lower state than the ground GND.

Figure 19:
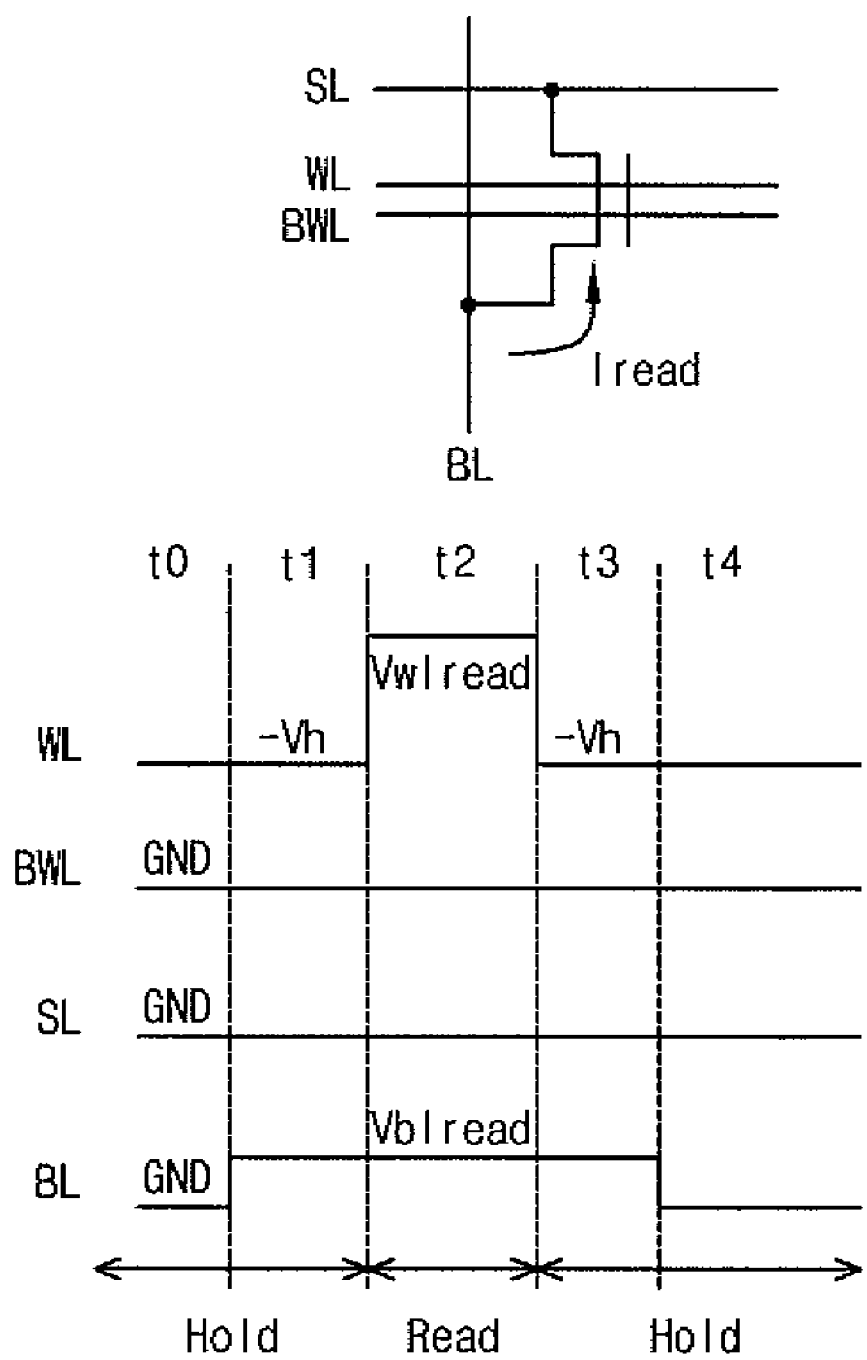
FIG. 19 is a view showing an embodiment of a multi bit read driving method according to the present invention.

FIG. 19 shows a read method as a driving method according to the present invention. In FIG. 19, t0, t1, t3, and t4 periods are hold periods maintaining data, and t2 is a period performing a read operation.

Concretely describing it, if in the t0 period, the word line WL=−Vh, the bottom word line BWL=GND, the sensing line SL=GND and the bit line BL=GND, the data of the floating body is maintained.

The ti period is a period applying a read voltage Vb1read to the bit line BL in order to sense the read current of the cell.

If in the t2 period, WL=Vw1read, the bottom word line BWL=GND, the sensing line SL=GND, and the bit line BL=Vb1read, the read current flows from the bit line BL to the sensing line SL. At this time, if the amount of flowed sensing current is larger than reference current, the data is 1 and if it is lower than the reference current, the data is 0.

IF in the t3 period, the word line WL=−Vh, the bottom word line BWL=GND, the sensing line SL=GND and the bit line BL=Vb1read, the read current stops.

If in the t4 period, the word line WL=−Vh, the bottom word line BWL=GND, the sensing line SL=GND, and the BL=GND, the voltage of hole stored in the floating body is maintained at a lower state than the ground GND.

Figure 20:
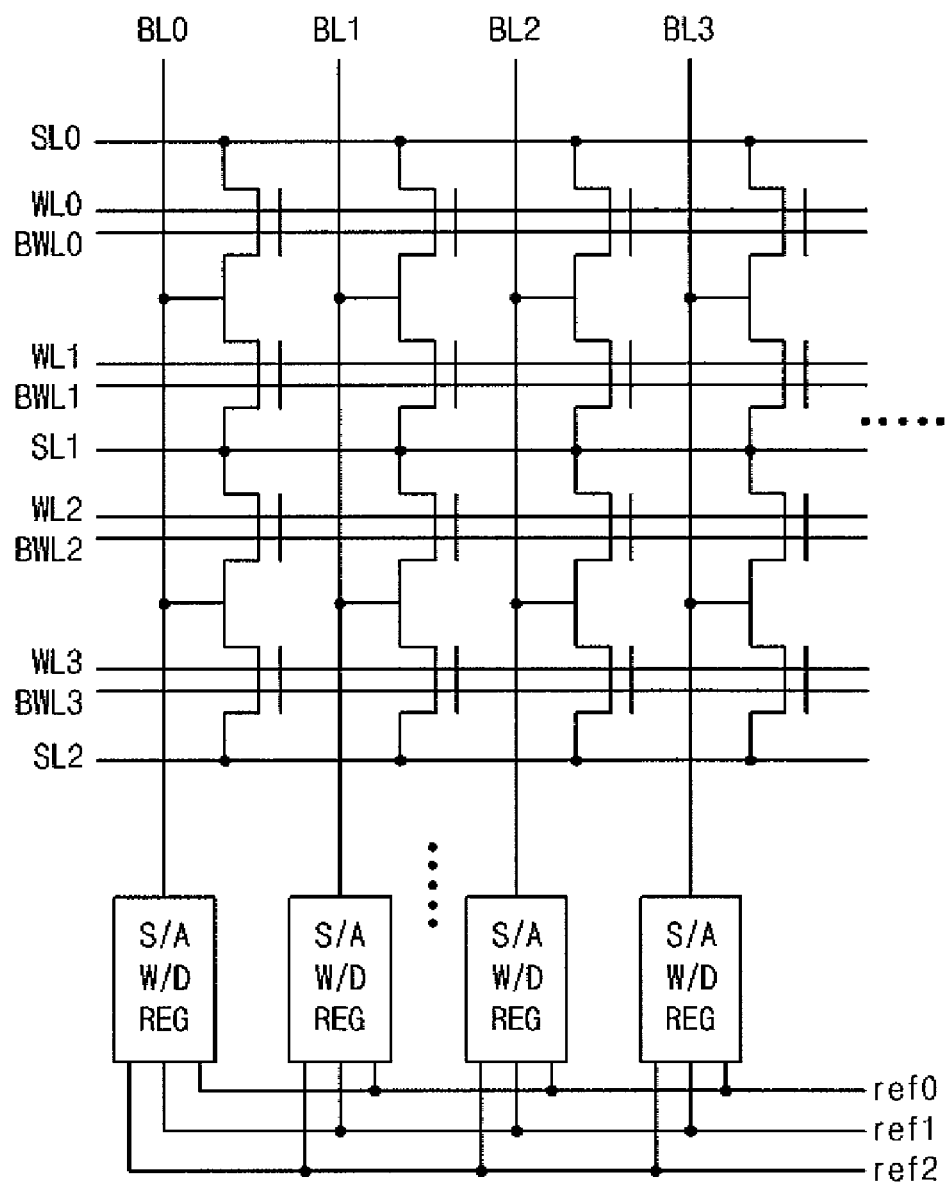
FIG. 20 is a view showing the 1-transistor type DRAM array structure for the multi bit of FIG. 14.

FIG. 20 is a circuit diagram showing a double gate cell array structure driving a multi-level according to the present invention. As shown, the respective two cells have the structure sharing the bit line contacts and the sensing line contacts. And, the word lines WL0, . . . , WL3, the bottom word lines BW0, . . . , BL3, and the sensing line SL0, . . . , SL2 are arranged in a row direction and the bit lines BL0, . . . , BL3 are arranged in a column direction. And, the respective bit lines BL0, . . . , BL 3 are constituted by a sense amp S/A, a write driver W/D, and a register block REG and each of these circuits is supplied with a reference voltage ref0, ref1, and ref2.

In FIG. 20, the sense amp S/A is operated as a circuit for distinguishing the data 11, 10, 01, 00 by sensing the cell data. And, the register block REG is a temporary memory circuit temporarily storing the data of the sense amp S/A. And, the write driver W/D is a circuit generating the driving voltages Write 11, Write 10, Write 01, Write 00 in the bit lines BL according to the write data when writing data in the cell.

Figure 21:
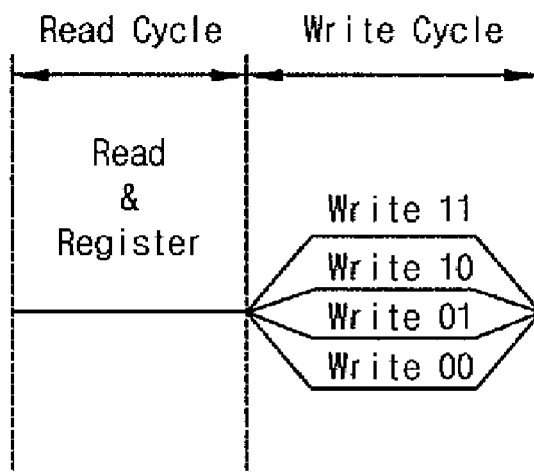
FIG. 21 is a view showing an example of a write cycle for the multi bit of FIG. 14.

FIG. 21 shows one example of a write process of the 1-transistor type DRAM according to the present invention.

As shown, the write process includes a read cycle and a write cycle. In the read cycle period, cell data are sensed and amplified for all the cells in a row selected and then, are stored in the register. And, in the write cycle, the data stored in the resister are back written to be restored. Meanwhile, cells to be newly written are written with new external data. At this time, the new external data can be stored by clearing and resetting the data previously stored in the register.

Figure 22:
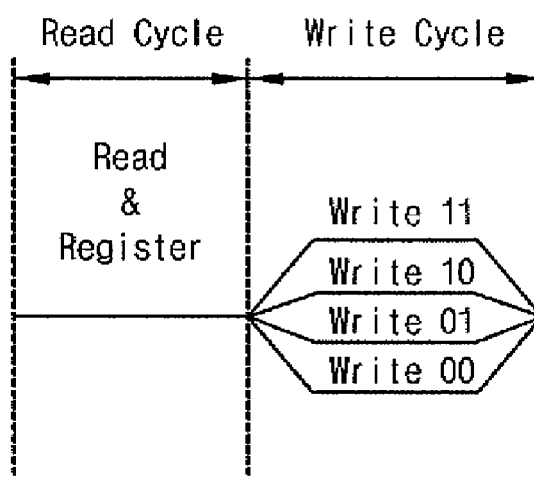
FIG. 22 is a view showing one example of a refresh cycle for the multi bit of FIG. 14.

FIG. 22 is a view showing a refresh method of the 1-transistor type DRAM according to the present invention. The refresh method can be simply performed through the read cycle and the write cycle. That is, in the read cycle period, the cell data are sensed and amplified for all the cells in a row selected and then, are stored in the register. Thereafter, in the write cycle, the data stored in the resister are back written, making it possible to perform the refresh.

Figure 23:
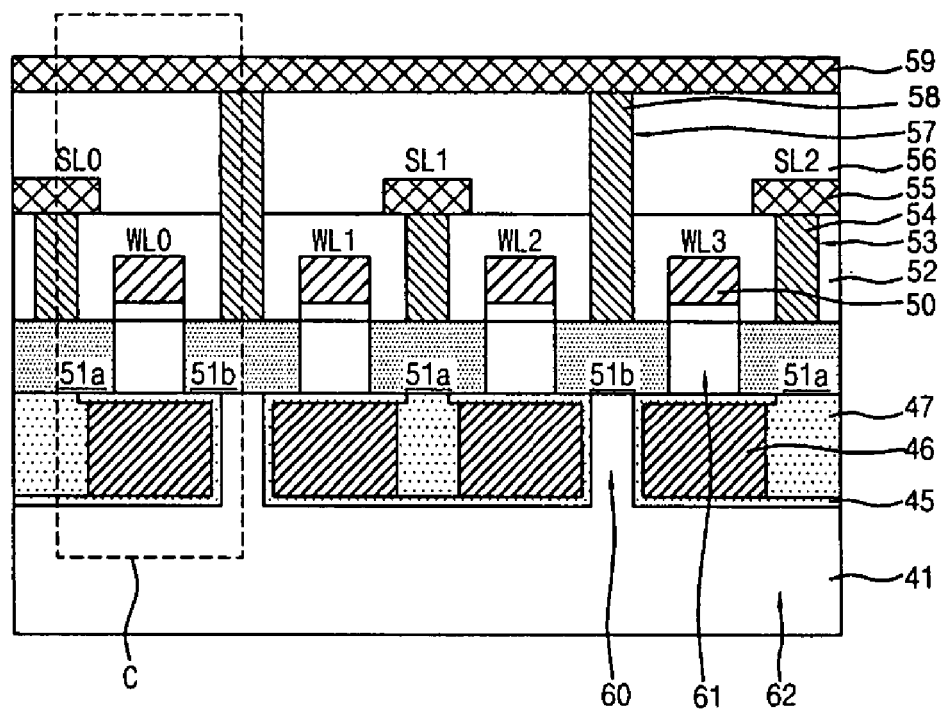
FIG. 23 is a cross-sectional view showing a DRAM device according to the present invention.

The cross section constitution of the DRAM device according to the present invention of FIG. 4 can be more concretly shown like FIG. 23.

Referring to FIG. 23, a plurality of gates 47 are formed on a silicon substrate 41 formed of bulk silicon, first and second junction regions, that is, source/drain regions 51a and 51b, are formed within the substrate surfaces on both sides of the respective gates 47, and a plurality of bottom gates 43 surrounded by a first isolating layer 45 within the silicon substrate 41 portion below the source/drain regions 51a, 51b are formed to be overlapped with each gate 50. At this time, the bottom gate 46 is formed to have a larger width than the gate 50. It can be appreciated that the gate 50 is formed in a stacked structure of a gate isolating layer and a gate conductive layer.

Continuously, a first interlayer dielectric layer 52 is formed on the silicon substrate 41 to cover the gate 50, a plurality of source lines 55 (or sensing lines) are formed on the first interlayer dielectric layer 52 to be contacted to the respective source regions 51a, a second interlayer dielectric layer 56 is formed on the first interlayer dielectric layer 52 including the source lines 55, and bit lines 59 are formed on the second interlayer dielectric layer 56 to be contacted to the drain regions 51b. Herein, the source lines 55 and the bit lines 59 each is contacted to the corresponding source region 51a and drain region 51b by means of a first contact plug 54 and a second contact plug 58. Furthermore, one source line 55 and one bit line 59 are formed to be shared between the neighboring DRAM cells.

In a DRAM device of the present invention as described above, a unit cell C is constituted by the 1-transistor structure including the gate 50 and the bottom gate 46. Also, in the transistor of the double gate structure, the substrate body 61 corresponding to a channel region below the gate 47 is floated likewise a semiconductor device implemented on a SOI wafer of the prior art, and the source region 51a is connected to the substrate bulk 62 by means of a silicon connecting part 60.

Therefore, the DRAM device of the present invention is implemented using the silicon substrate formed of the bulk silicon and is also implemented as a floating body type DRAM cell by making the substrate body have a floated SOI structure so that it can overcome the problems when the SOI wafer of the prior art is applied, having the advantage of the device implemented on the SOI wafer.

Also, the DRAM device of the present invention is constituted by a unit cell which is configured of the double gate 1-transistor further comprising the bottom gate, differently from a general DRAM device where a unit cell is constituted by an 1-transistor and an 1-capacitor, making it possible to remarkably reduce cell size.

Furthermore, in the DRAM device of the present invention, the 1-transistor floating body type DRAM cell does not destroy the cell data in a read operation according to a non destructive read out (NDRO) manner, making it possible to improve reliability and to raise a read speed.

Consequently, the present invention implements the DRAM cell in the SOI structure using the silicon substrate formed of the bulk silicon and also constitutes the unit cell by the 1-transistor of the double gate structure so that it can improve the device characteristic as well as overcom the difficulties in applying the SOI wafer and in particular, remarkably reduce the cell size to implement a high integrated DRAM device.

In FIG. 23, non-explained reference numerals 47, 53, and 57 represent the second isolating layer, the first contact hole, and the second contact hole, respectively.

Hereinafter, a method of manufacturing the DRAM device according to the present invention as described above will be described in detail with reference to FIGS. 24a to 24k.

Figure 24A:
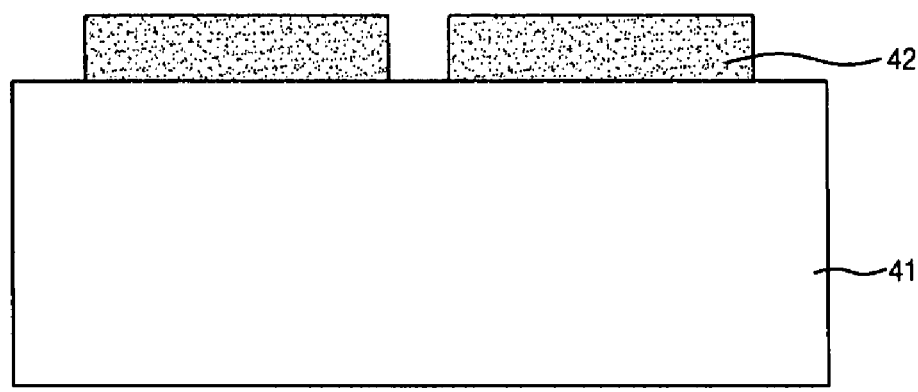
FIGS. 24a to 24k are views for explaining a manufacturing method of the DRAM device according to the present invention.

Referring to FIG. 24a, after a silicon substrate 41 formed of bulk silicon is prepared, an etching mask 42 exposing a portion of the silicon substrate 41 is formed on the silicon substrate 41. Herein, the silicon substrate 41 can be appreciated as a P type substrate and the etching mask 42 can be constituted by a photoresist film or a nitride film and an oxide film, etc.

Figure 24B:
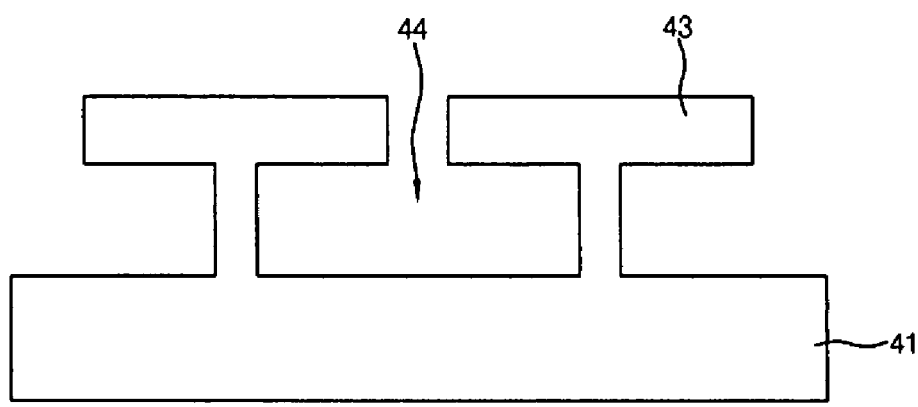

Referring to FIG. 24b, the exposed silicon substrate portion using the etching mask is isotropically etched, and therethrough, reverse-T type first grooves 44 defining T type silicon regions 43 are formed on the silicon substrate 41. Thereafter, the etching mask is removed.

Figure 24C:
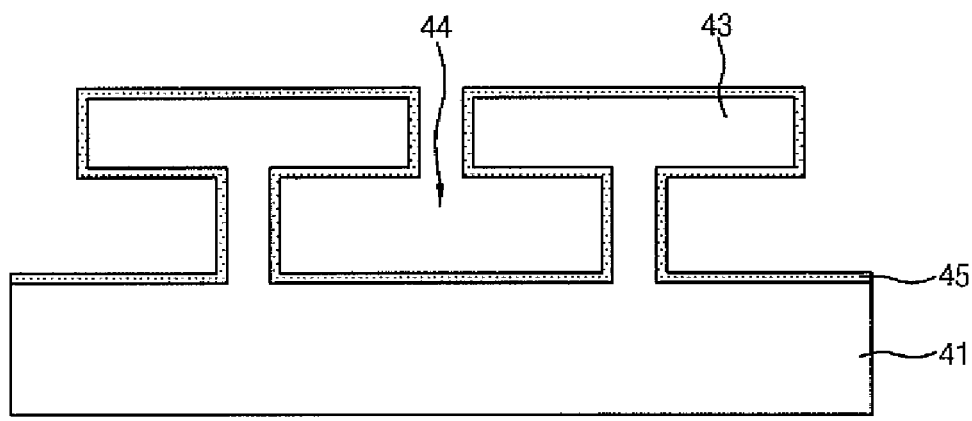

Referring to FIG. 24c, a first isolating layer 45 is formed over this silicon substrate 41, including the surface of the reverse-T type first groove 44. Herein, the first isolating layer 45 is formed by means of a thermal oxidation process, for example.

Figure 24D:
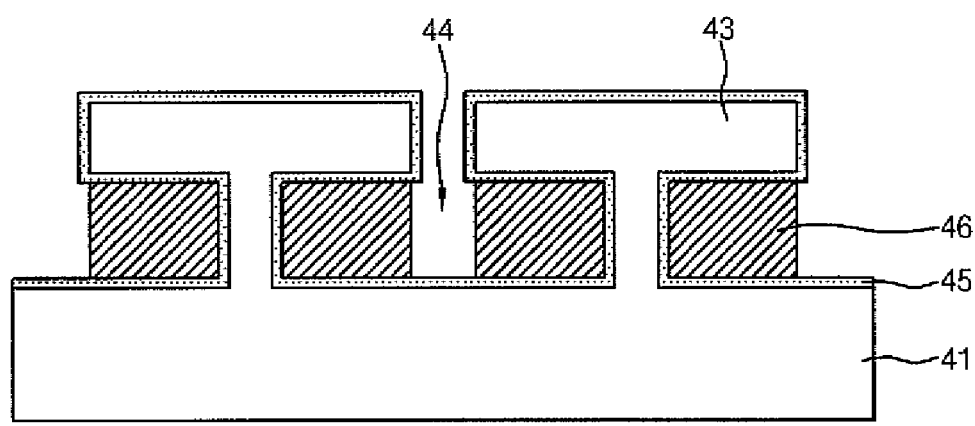

Referring to FIG. 24d, a conductive layer, for example, a silicon film is deposited to bury the reverse-T type first groove 44 over the silicon substrate 41 formed with the first isolating layer 45. Thereafter, bottom gates 46 are formed at both sides of the reverse-T type first groove, respectively, by etching a portion of the buried silicon film. Herein, the etching of the silicon film is performed by means of an etch back and performed by means of a combination of the etch back and a dry etch process using the etching mask.

Figure 24E:
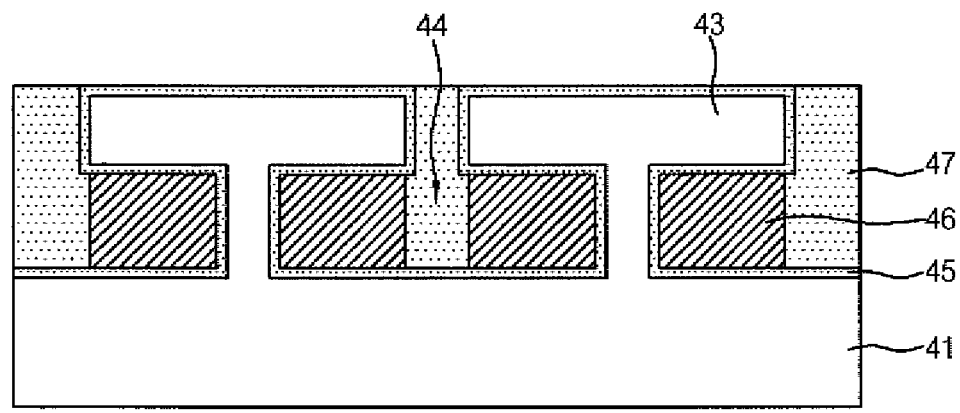

Referring to FIG. 24e, a second isolating layer 47 is buried in a space between the bottom gates 46, that is, within the reverse-T type first groove portion where the bottom gate 46 is not formed and therethrough, the bottom gates 46 are surrounded by the isolating layer constituted by first and second isolating layers 45 and 47.

Figure 24F:
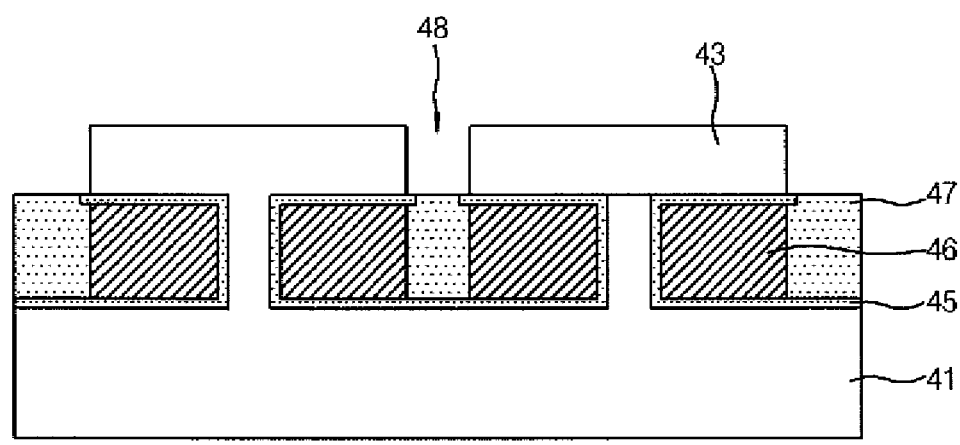

Referring to FIG. 24f, the first isolating layer 45 on the surface of the T type silicon region 43 and the first and second isolating layer 43 and 47 buried between the T type silicon regions 43 are removed by means of the etch back and therethrough, a second groove 48 is formed between the T type silicon regions 43.

Figure 24G:
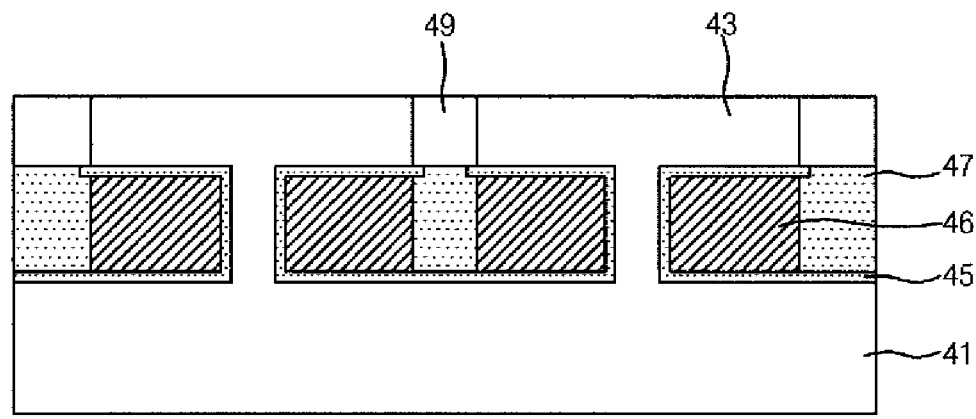

Referring to FIG. 24g, silicon 49 is buried within the second groove at the same thickness as the T type silicon region in order to interconnect the T type silicon regions 43.

Figure 24H:
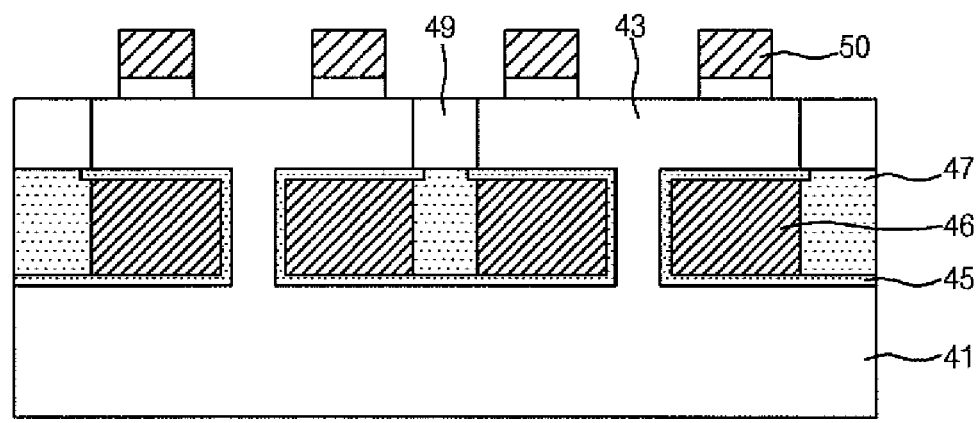

Referring to FIG. 24h, a plurality of gates 50 in a stacked structure formed of the gate isolating layer and the gate conductive layer are formed on the T type silicon regions 43. At this time, each gate 50 is formed at a position to be overlapped with the corresponding bottom gates 47 and is formed at a width allowing the bottom gate 47 to have a larger width.

Figure 24I:
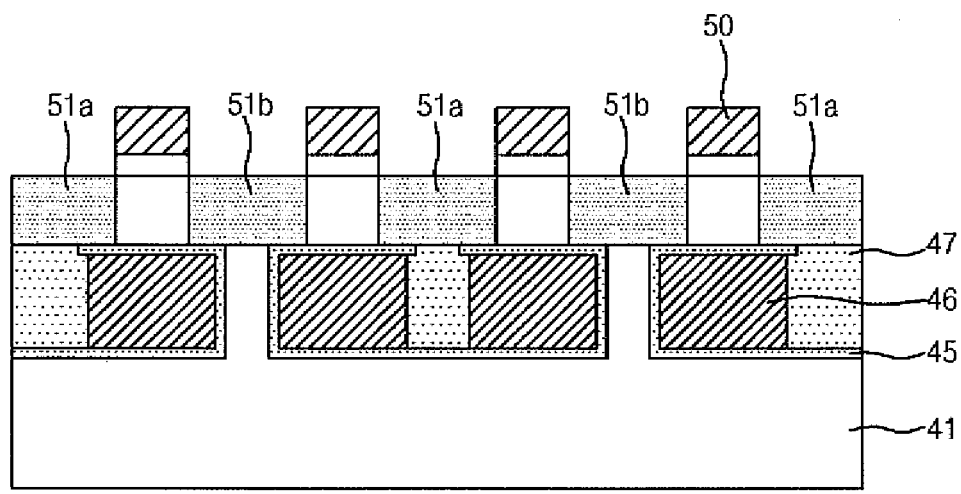

Referring to FIG. 24i, the first and second junction regions, that is, the source/drain regions 51a and 51b are formed by implanting predetermined conductive impurity, for example, high-concentration N type impurity ions such as As and P in the case of the P type silicon substrate 41 within the T type silicon regions of both sides of each gate 50, including the silicon buried within the second groove, thereby forming the cell structure constituted by the double data structure 1-transistor. Herein, a substrate body 61 corresponding to the region below the gate 50, that is, the channel region is floated by means of the first isolating layer 45 so that the floated substrate body 61 always indicates excellent silicon characteristics.

Meanwhile, the source region 51a is electrically connected to the substrate bulk 62, which is a region below the bottom gate 47, by means of a silicon connecting part of the T type silicon region so that the source region 51a can be easily applied with substrate bias likewise a general semiconductor device implemented on a silicon substrate.

Figure 24J:
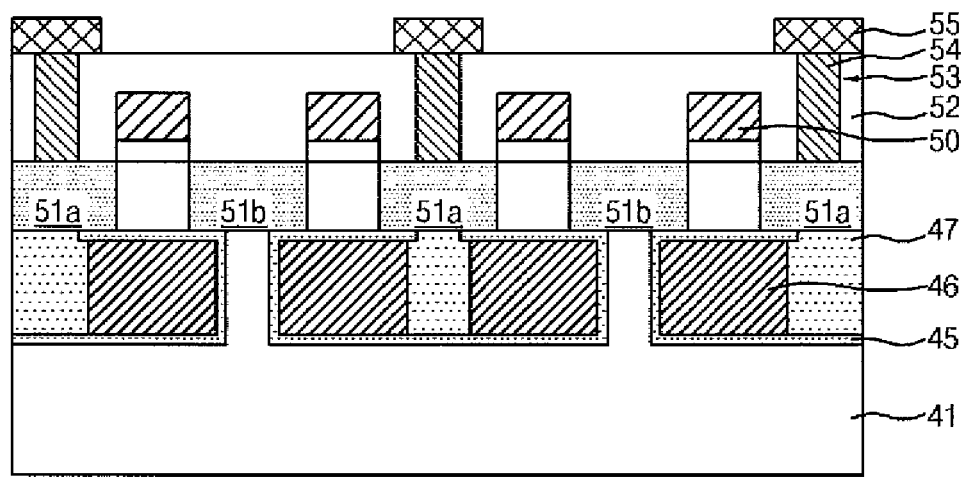

Referring to FIG. 24j, a first interlayer dielectric layer 52 is formed on the silicon substrate 41 formed with the double gate 1-transistor cell structure to cover the gates. Thereafter, after a plurality of first contact holes 53 exposing the source regions 51a, respectively, are formed by etching the first interlayer dielectric layer 52, the conductive layer are buried in the respective first contact holes 53 to form a plurality of first contact plugs 54. Thereafter, a layer for a wiring is deposited and then patterned on the first interlayer dielectric layer 52 so that a source line 55 (or a sensing line) electrically contacted to the corresponding source region 51a through the first contact plugs 54 is formed on the respective first contact plugs 54 and the first interlayer dielectric layer portion adjacent thereto. Herein, the source line 55 including the first contact plugs 54 are formed to be shared by the neighboring unit cells.

Figure 24K:
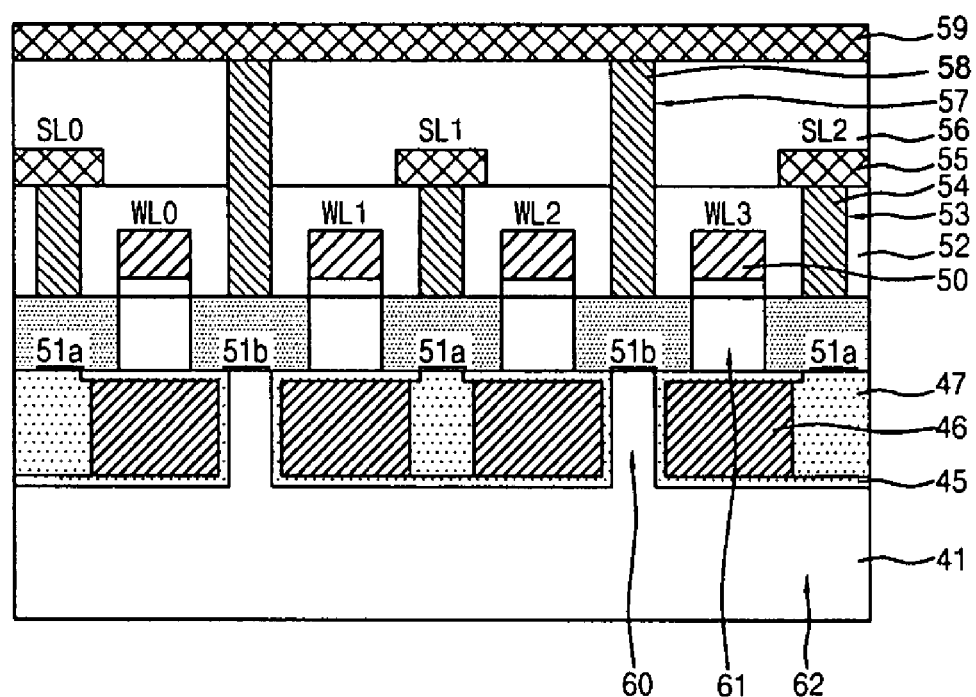

Referring to FIG. 24k, a second interlayer dielectric layer 56 is formed on the first interlayer dielectric layer 52 formed with the source line 55. Thereafter, after a plurality of second contact holes 57 exposing the drain regions 51b, respectively, are formed by etching the second and first interlayer dielectric layers 56 and 52, conductive layer are buried in the respective second contact holes 57 to form a plurality of second contact plugs 58. Thereafter, the layer for the wiring is deposited and then patterned on the second interlayer dielectric layer 56 so that a bit line 59 electrically contacted to the corresponding drain region 51b through the second contact plugs 58 is formed on the second contact plugs 58 and the second interlayer dielectric layer portion adjacent thereto. Herein, the second contact plugs 58 are formed to be shared by the neighboring unit cells.

Thereafter, although not shown, the manufacturing of the DRAM device constituted by DRAM cells in the double gate 1-transistor structure according to the present invention is completed by sequentially performing a series of well-known subsequent processes.

Meanwhile, in the manufacturing method of the DRAM device according to the present invention as described above, the present invention performs the formation of the source line including the formations of the first contact hole and the first contact plug and the formation of the bit line including the formations of the second contact hole and the second contact plug, respectively. However, as another embodiment of the present invention, the contact between the drain region and the bit line can be made by means of methods simultaneously forming the first contact hole and the first contact plug even on the first interlayer dielectric layer portion on the drain region when forming the first contact hole and the first contact plug, forming the layer pattern for the wiring on the first contact plug formed on the drain region when forming the source line, and forming the second contact hole and the second contact plug contacted to the layer pattern for the wiring within the second interlayer dielectric layer when forming the bit line.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

As described above, the 1-transistor type DRAM according to the present invention enables a stabilized cell driving operation.

Also, the 1-transistor type DRAM according to the present invention enables the multi-level driving having the double gate and enables a stabilized cell write operation and a low voltage operation.

Also, the present invention implements the floating body type DRAM cell in a SOI structure using a silicon substrate formed of bulk silicon, making it possible to improve the device characteristics to be operated at a high speed and at a low voltage, etc.

Also, the present invention implements the DRAM cell in the SOI structure using a general silicon substrate, making it possible to overcome reduction of productivity and difficulties in equipment and process development, which may be caused in applying a SOI wafer.

Also, the present invention constitutes the unit cell with the 1-transistor in the double gate structure so that it can remarkably reduce cell size as compared to the general DRAM cell and therethrough, making it possible to implement a highly integrated DRAM device Also, although not specifically explained, the present invention implements the 1-transistor floating body type DRAM cell so that the cell data are not destroyed in a read operation according to a non destructive read out (NDRO) manner, making it possible to improve reliability and to raise a read speed.

What is claimed is:

1. A driving method for an 1-transistor type DRAM having a double gate structure comprising:
    a data hold process biasing a word line and a bottom word line at a negative voltage level and biasing a sensing line and a bit line at a first constant voltage level;
    a data purging process resetting data by biasing the word line and the bottom word line at a second constant voltage level and biasing the sensing line and the bit line at the first constant voltage level; and
    a data write process biasing the word line and the bottom word line at the second constant voltage level and supplying a write data to the bit line.

2. The method as set forth in claim 1, further comprising after the data write process, a second data hold process holding the write data by biasing the word line and the bottom word line at the negative voltage level.

3. The method as set forth in claim 2, wherein the write data is digital logic 0 or 1.

* * * * *